United States Patent [19]
Tange et al.

[11] Patent Number: 6,127,620
[45] Date of Patent: Oct. 3, 2000

[54] CONVERGING SOLAR MODULE

[75] Inventors: Kyoichi Tange, Mishima; Tomonori Nagashima, Susono; Takashi Sagae, Handa; Yasuji Fukui, Chita; Mitsuaki Tomita, Tokoname, all of Japan

[73] Assignee: Toyota Jidosha Kabushiki Kaisha, Japan

[21] Appl. No.: 08/922,601

[22] Filed: Sep. 3, 1997

[30] Foreign Application Priority Data

Sep. 4, 1996 [JP] Japan ................................. 8-233753

[51] Int. Cl.$^7$ .................................................. H01L 31/052
[52] U.S. Cl. ...................................... 136/246; 250/203.4
[58] Field of Search .................................. 136/246, 259; 250/203.4; 126/573, 581, 604

[56] References Cited

U.S. PATENT DOCUMENTS

| | | | |
|---|---|---|---|
| 2,604,601 | 7/1952 | Menzel | 313/96 |
| 3,229,682 | 1/1966 | Perlmutter et al. | 126/270 |
| 3,478,219 | 11/1969 | Nutz | 250/220 |
| 3,630,020 | 12/1971 | Chase et al. | 60/23 |
| 4,082,947 | 4/1978 | Haywood et al. | 250/203 |
| 4,179,612 | 12/1979 | Smith | 250/230 R |
| 4,223,174 | 9/1980 | Moeller | 136/246 |
| 4,316,084 | 2/1982 | Stout | 250/203 |
| 4,355,630 | 10/1982 | Fattor | 126/438 |
| 4,771,764 | 9/1988 | Cluff | 126/440 |
| 4,794,909 | 1/1989 | Eiden | 126/425 |
| 5,286,305 | 2/1994 | Laing et al. | 136/246 |
| 5,319,188 | 6/1994 | Cole | 250/206.2 |
| 5,512,742 | 4/1996 | Mattson | 250/203.4 |
| 5,602,384 | 2/1997 | Nunogaki et al. | 250/203.4 |
| 5,632,823 | 5/1997 | Saharan | 136/246 |

FOREIGN PATENT DOCUMENTS

| | | |
|---|---|---|
| 3106679 A1 | 9/1982 | Germany. |
| 4013843 A1 | 10/1991 | Germany. |
| 42 21 896 | 1/1994 | Germany. |
| 4341552 A1 | 6/1995 | Germany. |
| 62-5315 | 6/1985 | Japan. |
| 62-5315 | 1/1987 | Japan. |
| WO 93/25856 | 12/1993 | WIPO. |

OTHER PUBLICATIONS

European Search Report dated Sep. 17, 1999 (2 pages).
Communication dated Sep. 23, 1999 (1 page).
Australian Office Action dated Nov. 24, 1997 (2 pages).

*Primary Examiner*—Nam Nguyen
*Assistant Examiner*—Michael C. Miggins
*Attorney, Agent, or Firm*—Finnegan, Henderson, Farabow, Garrett & Dunner, L.L.P.

[57] ABSTRACT

In order to provide a converging solar module which achieves effective electricity generation, as well as significant reduction of costs and driving energy required to track the sun, a cell stage 20 carrying solar cells 16 is provided opposite to converging lenses 10. Some elastic members are provided between a pair of adjacent side edges of the cell stage 20 and corresponding side walls of a vessel 18. Along the other pair of side edges, stage driving bars 24 are provided. The stage driving bars 24 are moved horizontally by opening/closing operations of feeder valves X1, X2, Y1, Y2 and drain valves X3, X4, Y3, Y4 thereby moving the cell stage 20 horizontally in the direction perpendicular to the direction in which the stage driving bars 24 have moved. With an action of the elastic members 22 and the stage driving bars 24, the position of the cell stage 20 is adjusted such that the solar cells 16 thereon are brought into a position where converged spots 14 are formed.

3 Claims, 22 Drawing Sheets

CONVERGING SOLAR MODULE

BACKGROUND OF THE INVENTION

1. Field of the Invention

The present invention relates to an improvement to a converging solar module capable of performing efficient electricity generation by converting, while tracking, sunlight.

2. Description of the Prior Art

Conventionally, a solar battery has been utilized for various purposes, and use of such a solar battery in generating relatively high power electricity has also been considered. In constituting such a large-power generating system utilizing a solar battery, the solar battery is required to generate an increased amount of electricity, and it is therefore necessary to increase an amount of light coming into the solar cell. As means for increasing the amount of incoming light, a converging solar module has been proposed. With this module, since sunlight is converged through a lens, an increased amount of light is introduced. As a result, a usage area of an expensive solar battery can be reduced, as well as reducing the costs of the module.

More particularly, in a converging solar module, sunlight is converged so as to be 10 to 1000 times more intense before irradiating a solar cell. Thus, only an area of the solar cell that is reduced to ¹/₁₀ to ¹/₁₀₀₀ in size is needed to receive the same amount of sunlight, which contributes to a considerable reduction of costs. In this case, however, such a module requires a larger converging lens, not to mention a larger pedestal for holding the lens.

Provided that the sun always stays at the same position, as shown in FIG. 24, the sunlight 12 is converged through a converging lens 10 to form a converged spot at a constant point, that is, at the focal point of the lens 11 or the vicinity thereof, i.e., a small area including the focal point. Thus, with a solar cell 16 placed where the converged spot 14 is formed, effective electricity generation can be performed.

In reality, however, as the sun moves over a period of time, the incoming direction of the sunlight 14 to the converging lens 10 varies with time. This may cause the converged spot 14 to be formed off the solar cell 16 with some incoming angles, as shown in FIG. 25, resulting in a considerably reduced amount of electricity being generated by the solar cell 16.

Therefore, in order to secure a sufficient amount of sunlight irradiating the solar cell 16, it is necessary for the converging lens 10 and the solar cell 16 to always be facing in the direction from which the sunlight is coming.

Japanese Utility Model laid-Open Publication No. Sho 62-5315 discloses such a solar module, in which, as shown in FIG. 26, the converging lens 10 and the solar cell 16 are controlled so as to always face the sun by means of a tracking mechanism (not shown). With this arrangement, the converged spot 13 always falls within the solar cell 16, so that favorable generation of electricity is achieved all the time.

In the module of FIG. 26, however, since it is necessary to move both the converging lens 10 and the solar cell 16, and thus the pedestal holding them, a large mechanism is required to move such large components, including a converging lens 10 which generally has a large size and thus a heavyweight. This inevitably adversely affects the costs. Moreover, since such a large tracking mechanism is driven with a large force, the generated electricity is partly consumed for driving the mechanism. This resultantly deteriorates the generation efficiency of the whole system.

Further, when the temperature of the solar cell 16 has risen due to converged sunlight, the solar cell 16 needs to be cooled down, or else the performance of electricity generation will be deteriorated. Therefore, a cooling mechanism is necessary in addition to the aforementioned tracking mechanism, which results in a complicated structure of the overall system.

SUMMARY OF THE INVENTION

The present invention has been conceived to overcome the above problems and aims to provide a converging solar module which can significantly reduce driving energy for tracking and relevant costs, and perform effective electricity generation.

In order to achieve the above object, according to a first aspect of the present invention, there is provided a converging solar module comprising:

a plurality of converging lenses for converging sunlight;

a plurality of solar cells each arranged where a converged spot is formed, the converged spot being formed at a focal point of each of the plurality of converging lens or a vicinity thereof;

a cell stage for carrying the solar cells;

a position detection sensor provided to the cell stage in a position corresponding to one of the plurality of converging lenses; and driving means for moving either one of the cell stages or the plurality of converging lenses such that a converged beam from the plurality of converging lenses falls on the center of the position detection sensor to form a converged spot thereon;

wherein the driving means utilizes hydro-pressure.

According to a second aspect, in the converging solar module of the first aspect, the cell stage is accommodated within a vessel and floats on water poured into the vessel.

According to a third aspect, in the converging solar module of the first aspect, the cell stage is accommodated within a vessel and sinks in water poured into the vessel.

According to a fourth aspect, in the converging solar module of the first aspect, the cell stage is movable in the horizontal direction, supported on a pair of adjacent side edges thereof by elastic members, and provided on another pair of adjacent side edges thereof with the driving means, the driving means comprising a pressing member which is driven by hydro-pressure.

According to a fifth aspect, in the converging solar module of the first aspect, the cell stage is supported by and above a stage pedestal which is movable in the horizontal direction by a waterwheel which is rotated by hydro-pressure.

According to a sixth aspect, in the converging solar module of the first aspect, the position detection sensor comprises four trapezoid heat collecting panels together forming a square having a hole at the center which is as large as a solar cell and covered by a transparent member or reflecting member; and a shape memory alloy ON-OFF valve for switching hydro-pressure for driving the driving means is provided below each of the four trapezoid heat collecting panels.

According to a seventh aspect, in the converging solar module of the second aspect, the cell stage is supported vertically movable by a stage pedestal so that a vertical position thereof is adjusted by adjusting an amount of water in the vessel in accordance with movement of the focal point of the converged beam.

According to an eighth aspect, in the converging solar module of the second aspect, the water in the vessel is drained when a problem is detected in the solar module.

According to a ninth aspect, in the converging solar module of the seventh aspect, the water in the vessel is drained when a problem is detected in the solar module.

According to a tenth aspect, in the converging solar module of the third aspect, the vessel is installed tilting as a whole in which water is circulating from a lower part thereof to an upper part thereof.

According to an eleventh aspect, in the converging solar module of the third aspect, the water is held in the vessel by a valve provided at the lower part of the vessel and closed when a problem is detected in the solar module.

According to a twelfth aspect, in the converging solar module of the tenth aspect, the water is held in the vessel by a valve provided at the lower part of the vessel and closed when a problem is detected in the solar module.

According to a thirteenth aspect, there is provided a converging solar module comprising:

a plurality of converging lenses for converging sunlight;

a plurality of solar cells each arranged where a converged spot is formed, the converged spot being formed at a focal point of each of the plurality of converging lens or a vicinity thereof;

a cell stage for carrying the solar cells; and driving means for moving either one of the cell stages or the plurality of converging lenses according to a program pre-set such that a converged beam from the plurality of converging lenses falls on the center of the position detection sensor to form a converged spot thereon;

wherein the driving means utilizes hydro-pressure.

According to fourteenth aspect, there is provided, a converging solar module comprising:

a plurality of converging means for converging sunlight;

a plurality of electricity generation means arranged corresponding to the plurality of converging means, for generating electricity using converged sunlight;

detection means for detecting a position of a converged spot of the converged sunlight;

means for moving either one of the plurality of converging means or the plurality of electricity generation means based on the position of the converged spot detected, whereby the plurality of electricity generation means are brought into a position where the converged spot is formed.

According to fifteenth aspect, there is provided a cell stage for carrying solar cells, having a square shape whose one corner extends in the vertical direction, wherein two edges forming the corner extending in the vertical direction have tapered parts formed thereon which contact stage driving bars;

two edges opposing the two edges having the tapered parts formed thereon are supported by elastic members; and the cell stage is horizontally movable when the stage driving bars move horizontally, in cooperation with forces generated by an action of the tapered part in a direction where the stage driving bar has moved and in a direction perpendicular to that direction and a reacting force generated by the elastic members.

BRIEF DESCRIPTION OF THE DRAWINGS

The above and the other objects, features, and advantages, will become further apparent from the following description of the preferred embodiment taken in conjunction with the accompanying drawings wherein.

DESCRIPTION OF THE PREFERRED EMBODIMENTS

In the following, preferred embodiments of the present invention will be described based on the accompanying drawings.

Embodiment 1

Figure 1:
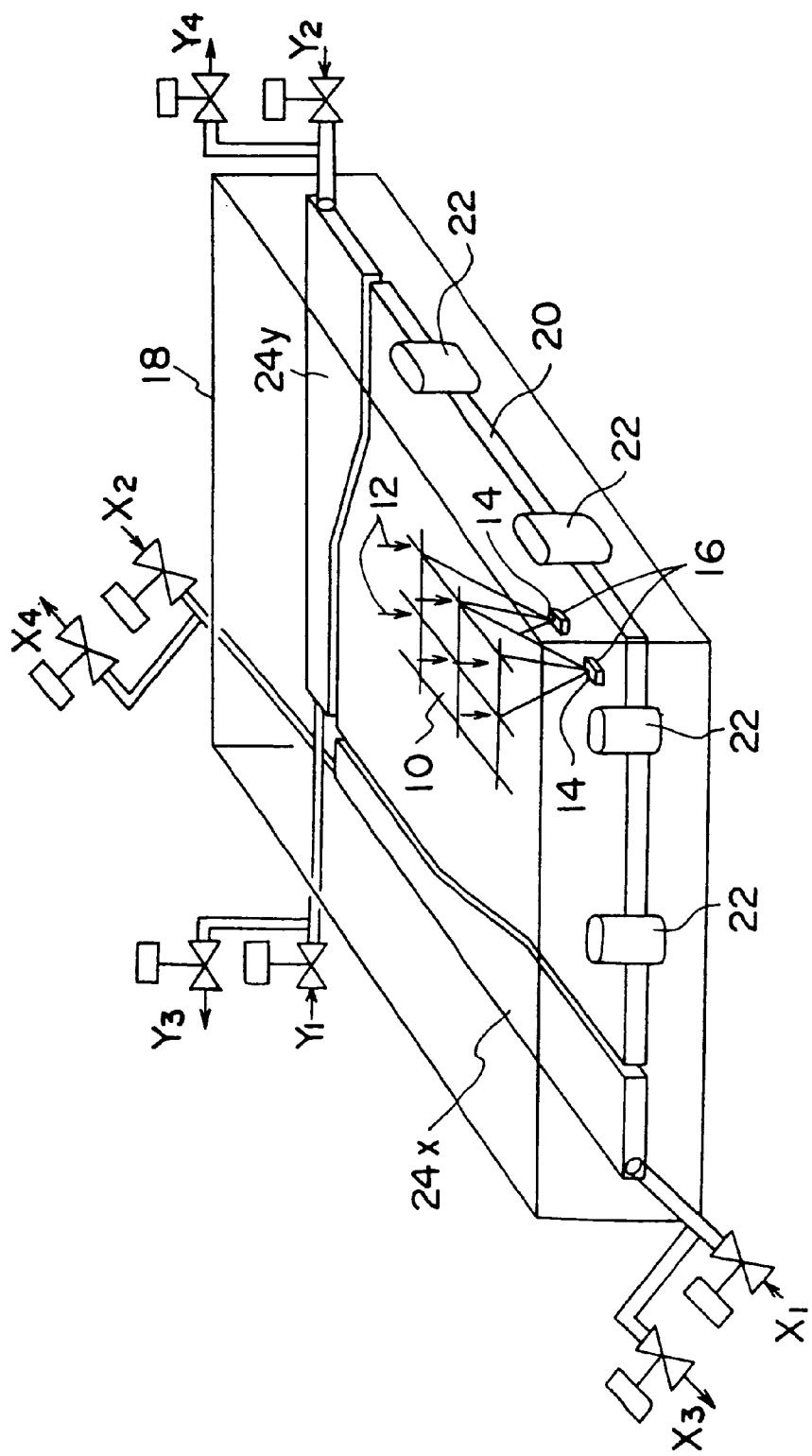
FIG. 1 is a perspective view of a converging solar module according to a first preferred embodiment of the present invention.

FIG. 1 is a perspective view showing a converging solar module according to a first preferred embodiment of the present invention. Sunlight 12 incident on converging lenses 10 (partially shown) is converged thereby, and forms converged spots 14. Solar cells 16 are arranged where the converged spots 14 are formed on a cell stage 20 inside a vessel 18. The cell stage 20 floats on or sinks in water contained in the vessel 18, opposite to the converging lenses 10.

In the above structure, the solar cells 16 are adhered and sealed to the cell stage 20. Due to the sealing, the electrodes of the solar cells 16, which are non-resistive to water, are protected from water by being buried in the cell stage 20. With this arrangement, the solar cells 16 can be cooled directly by cooling water. In the case of a floating cell stage 20, the solar cells 16 on the stage 20 are cooled by water squirted toward them or flowing on the stage 20. For a cell stage 20 sunk in water, the solar cells 20 are also sunk and cooled by water.

In order to cause a cell stage 20 to sink in water, the cell stage 20 may be made of material, for instance, having a heavier relative density than that of water, and it is sunk so as to be placed on a stand (not shown). The cell stage 20 is preferably set slidably on the stand for horizontal movement.

A floating cell stage 20 can more freely move in the horizontal direction.

Elastic members are provided between pairs of adjacent side edges of the cell stage 20 and of the corresponding side walls of the vessel 18 to support the cell stage 20, which is horizontally movable.

Along the remaining side edges, a pair of stage driving bars 24x, 24y for moving the cell stage 20 in the horizontal direction are provided so as to contact relevant side edges of the cell stage 20. The stage driving bars 24x, 24y respectively have two feeder valves X1 and X2, Y1 and Y2, and two drain valves X3 and X4, Y3 and Y4. In this embodiment, the stage driving bars 24x, 24y constitute a pressing member, that is, driving means of the present invention.

Figure 2:
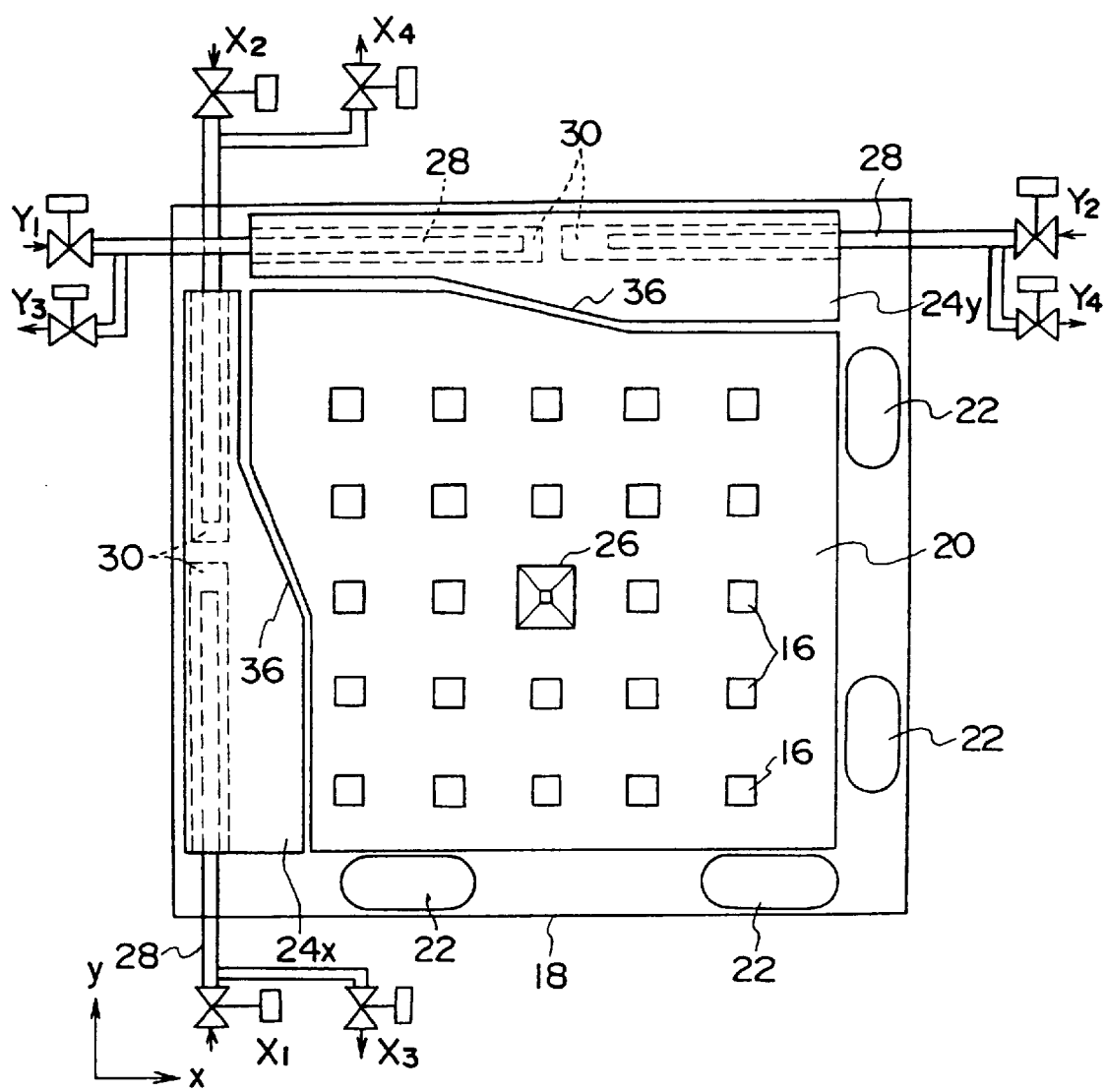
FIG. 2 is a plane view of the embodiment shown in FIG. 1.

FIG. 2 is a plan view showing the solar module shown in FIG. 1 with converged lenses 10 omitted.

The cell stage 20 has a square shape having one corner extending in the diagonal direction. On the cell stage 20, a plurality of solar cells 16 are provided with equal intervals, in which a solar cell 16 is replaced by a position detection sensor 26. The position of the cell stage 20 is adjusted by horizontally moving it in the x and y directions by using the elastic members 22 and the stage driving bars 24x, 24y so that a converged spot 14 is always formed at the center part of the position detection sensor 26. Since the sensor 26 is located where a solar cell should be located, when a converged spot 14 is formed at the center of the sensor 26, converged spots 14 are also formed on solar cells 16. With this arrangement, adjustment to a cell stage 20 to achieve proper positioning will result in bringing the solar cells 16 to where converged spots 14 are formed.

Preferably, an elastic member 22 may be a plate spring rolled up into either a circle or oval attached at spots to the side wall of the vessel 18 so that the cell stage 20 moves smoothly.

The stage driving bars 24x, 24y have receiver holes 30 formed inside them, into which hydro-pressure pipes 28 respectively extending from the feeder valves X1, X2, Y1, Y2 are inserted. The receiver holes 30 each have a larger inner diameter than the external diameter of the hydro-pressure pipe 28 so as to prevent abrasion between the inner surface of the former and the external surface of the latter which may be caused by the stage driving bars 24x, 24y moving in the x and y directions.

The hydro-pressure pipes 28 are secured to the side walls of the vessel 18 and sealed to prevent leaking water.

An operation to horizontally move the cell stage 20 by using the stage driving bars 24x, 24y will be described in the following.

Figure 3:
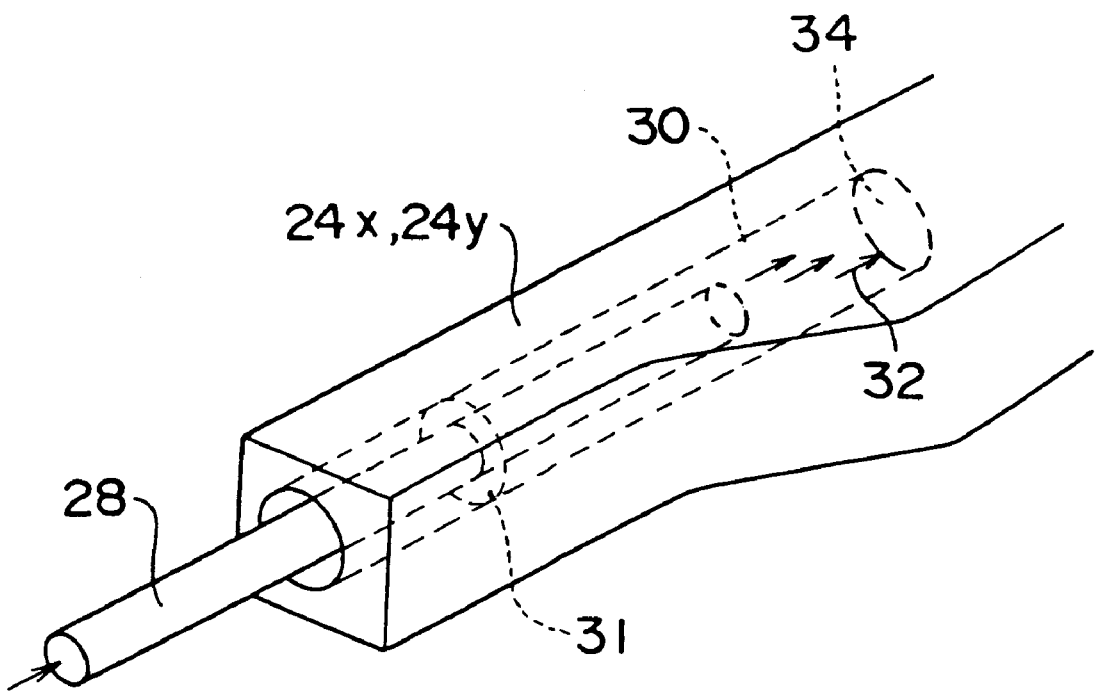
FIG. 3 is a perspective view of a stage driving bar used in the embodiment shown in FIG. 1.

FIG. 3 is an enlarged view showing a part of the hydro-pressure pipe 28 inserted into the receiver hole 30. Although there is some space between the external surface of the hydro-pressure pipe 28 and the inner surface of the receiver hole 30 as the external diameter of the former is smaller than the inner diameter of the latter, a sealing member 31, such as an O ring, is provided at a predetermined position of the former to prevent water supplied from the pipe 28 into the receiver hole 30 from leaking to the outside through the space. With this arrangement, pressurized water squirted from the tip end of the hydro-pressure pipe 28 hits the bottom surface of the receiver hole 30, whereby a relevant stage driving bar 24x, 24y is forced to move by the hydro-pressure in the direction where the ressurized water 32 was squirted. To not hinder this movement, water is drained from the receiver hole 30 on the opposite side (not shown in FIG. 3).

Referring again to FIG. 2, take the case where the feeder valve X1 and the drain valve X4 are opened, while the feeder valve X2 and the drain valve X3 are closed. Pressurized water 32 is squirted into the receiver hole 30 via the feeder valve X1, while water is drained from the opposite receiver hole 30 via the drain valve X4. As a result, the stage driving bar 24x for moving the cell stage 20 in the x direction, moves in the positive direction of the y axis. Upon this movement, the cell stage 20, which is in contact with the stage driving bar 24x via its tapered edge 36 as shown in FIG. 2, is pressed in the positive direction of the x axis via the tapered edge 36, thereby being moved horizontally in the right direction of this drawing.

With the above state, the feeder valve X1 and the drain valve X4 are closed and the feeder valve X2 and the drain valve X3 are opened. The stage driving bar 24 moves horizontally in the negative direction of the y axis. Then, as a result of being pushed toward the negative direction of the X axis by the elastic members 22, the cell stage 20 is moved horizontally in the left direction in the drawing.

When the feeder valves X1, X2 and drain valves X3, X4 are all closed, the stage driving bar 24x remains stationary in the present position with no water fed, drained, or leaked with respect to the receive holes 30, whereby the position of the cell stage 20 can be fixed.

To move the cell stage 20 horizontally in the y axis direction, the feeder valves Y1, Y2 and the drain valves Y3, Y4 are opened/closed similarly to the above, so that the stage driving bar 24y is moved in the x axis direction in the drawing. As a result, the cell stage 20 moves horizontally in the y axis direction with actions of the tapered edge 36 and the elastic members 22. The position of the cell stage 20 can be similarly fixed with the feeder valves Y1, Y2 and the drain valves Y3, Y4 being all closed.

Successive research and experiments proved that the cell stage 20 moved at approx. 0.5 to 3 mm per second when it was translated by using the stage driving bars 24x, 24y of this embodiment. Therefore, by setting a desired period of time for relevant feeder and drain valves to stay open, it is possible to cause the cell stage 20 to move by between 1 and 10 mm per one opening/closing operation. Although a movement extent of this much is preferable in adjusting the position of the cell stage 20 such that converged spots 14 fall on the solar cells 16, the movement extent can be desirably determined depending on the size and other factors of solar cells 16 in use.

In the above operation wherein the cell stage 20 moves in the positive direction of the x axis in FIG. 2, this rightward movement is hindered by the stage driving bar 24y whose tapered edge 36 abuts on the cell stage 20. In order to prevent this problem, the stage driving bar 24y may be constructed so as to be freely movable in the x direction so as not to hinder the movement of the cell stage 20 in the x direction. To be specific, the stage driving bar 24y is constructed such that it can move in the x direction along with the cell stage 20 when the feeder and drain valves Y1, Y2, Y3, Y4 are all closed. Likewise, the stage driving bar 24x is also structured such that it can move freely in the y direction along with the cell stage 20 moving in the y direction.

In order to have stage driving bars 24x, 24y constructed as above, the stage driving bars 24x, 24y maybe floated, and the feeder valves X1, X2, Y1, Y2 and the drain valves X3, X4, Y3, Y4 may be connected to flexible resin tubes, and so on.

When a call stage 20 which either floats or sinks, as described above, has a light weight, such as 1 to 5 kg/m$^2$, it can be fully driven by a small hydro-pressure, such as that of tap water (1–5 kg/m$^2$).

Figure 4:
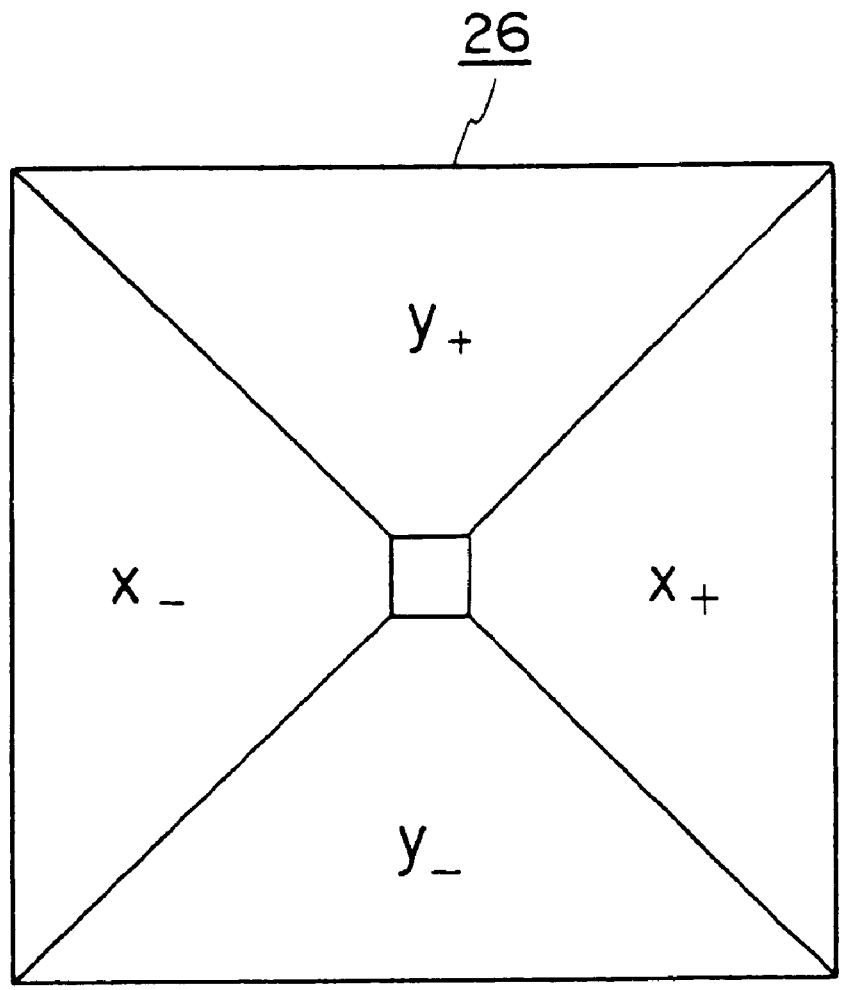
FIG. 4 is a diagram showing a position detection sensor used in the embodiment shown in FIG. 1.

FIG. 4 is an enlarged view showing the position detection sensor 26 shown in FIG. 2. The position detection sensor 24 consists of four trapezoid sensors x+, x−, y+, y−, together forming a square. Respective trapezoid sensors x+, x−, y+, y− contact with one another via the edges of the same length, leaving a hole surrounded by the four sensors at the center of the square. This hole is square in FIG. 4, but it may be circular or of any other desired shape.

With a converged spot 14 formed on the sensors x+, x−, y+, y−, the feeder valves X1, X2, Y1, Y2 and the drain valves X3, X4, Y3, Y4 are opened/closed by a controller (not shown) so that the cell stage 20 is moved in the direction of a sensor where the converged spot 4 is mainly formed.

Figure 5:
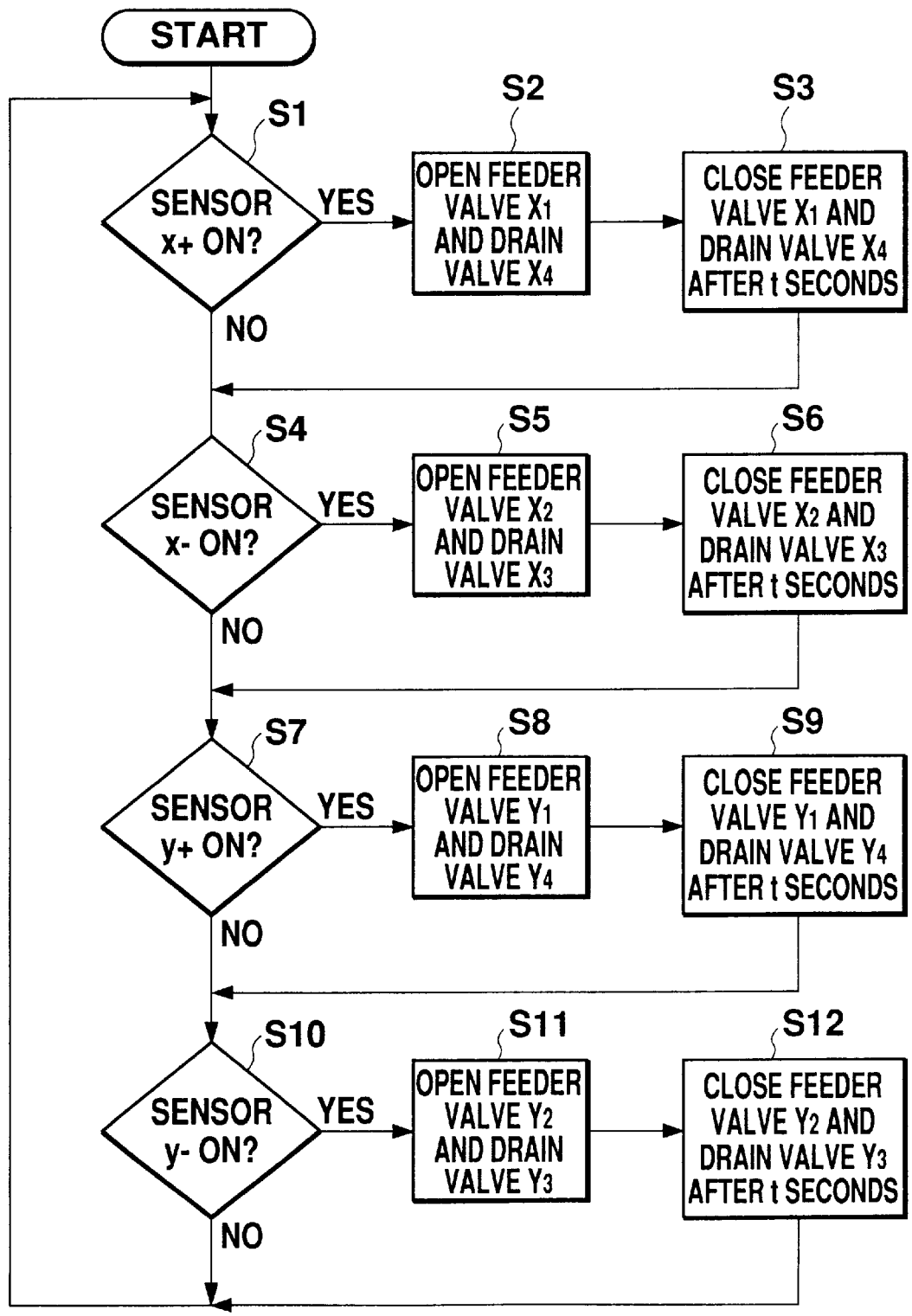
FIG. 5 is a flowchart of controlling the movement of a cell stage used in the embodiment shown in FIG. 1.

FIG. 5 is a flowchart of controlling the movement of the cell stage 20 by using this position detection sensor 26. A converged spot 14 is formed on the sensor x+ of the position detection sensor 26, the sensor x+ is turned on (S1), upon which the feeder valve X1 and the drain valve X4 are opened, while the feeder valve X2 and the drain valve X3 remain closed (S2). As a result, the cell stage 20 moves in the positive direction of the x axis until the converged spot 14 again falls on the center hole of the position detection sensor 26.

After a predetermined period of time (t seconds) has passed, the feeder valve X1 and the drain valve X4 are closed (S3), so that all the valves, namely the feeder valves X1, X2 and the drain valves X3 and X4, are closed whereby the cell stage 20 stops moving and remains stationary in the present position. Based on the fact that the cell stage 20 moves at the speed of 0.5 to 3 mm per second, the predetermined period of time (t seconds) is determined to be sufficient to allow the cell stage 20 to move by approx. 1 to 10 mm at one time.

Note that if the sensor x+ is not turned on at S1, the process goes on to the next step without opening either the feeder valve X1 or the drain valve X4.

Subsequently, if the sensor x− is turned on with a converged spot 14 formed thereon (S4), the feeder valve X2 and the drain valve X3 are opened, while the feeder valve X1 and the drain valve X4 remain closed (S5). Similar to S3, the feeder valve X2 and the drain valve X3 are closed after t seconds (S6). Then, the cell stage 20 is pushed by the elastic members 22, moving toward the negative direction of the x axis. This causes the position detection sensor 26 to move in the direction of the converged spot 14 until the spot 14 again falls on the center hole of the sensor 26.

Likewise, opening/closing of the feeder valves Y1, Y2 and the drain valves Y3, Y4 are controlled based on the ON/OFF states of the sensors y+, y− at S7 to S12, so that the cell stage 20 is also moved in the y direction.

Once the converged spot 14 is again formed on the center hole of the position detection sensor 26 as a result of the above control, none of the sensors x+, x−, y+, y− is turned on, so that all the valves, i.e., the feeder valves X1, X2, Y1, Y2 and the drain valves X3, X4, Y3, Y4, are closed, whereby the cell stage is fixed at the present position.

When a converged spot 14 is formed on the center hole of the position detection sensor 26 which is located where a solar cell 16 should be located, converged spots 14 are also formed on respective solar cells 16 so that normal electricity generation is carried out.

Figure 6A:
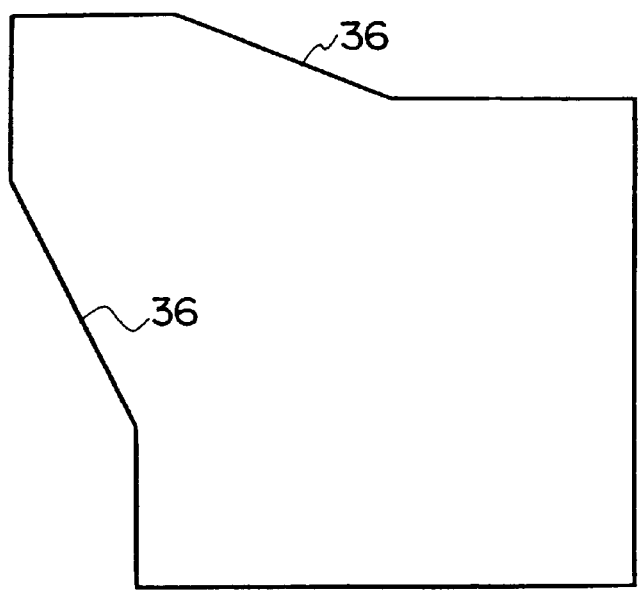
FIG. 6A is a diagram showing an example of a cell stage used in the embodiment shown in FIG. 1.
Figure 6B:
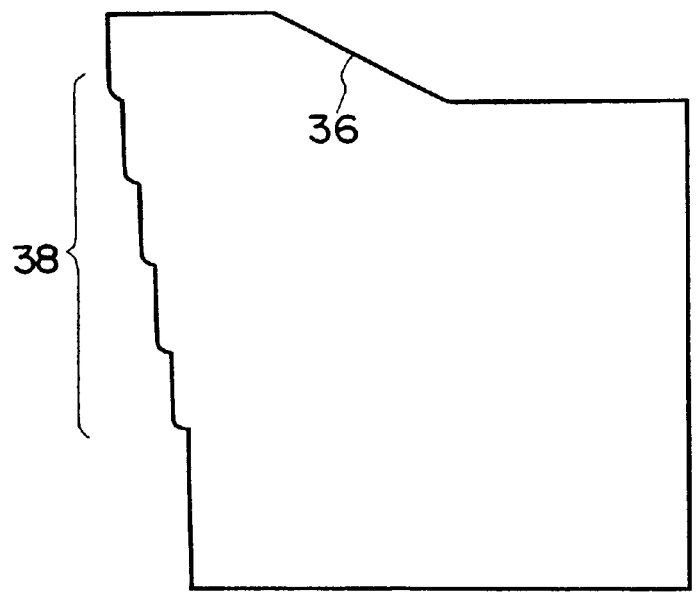
FIG. 6B is a diagram showing an example of a cell stage used in the embodiment shown in FIG. 1.

FIG. 6 is a diagram showing cell stages 20 having various shapes according to this embodiment; FIG. 6A shows a cell stage 20 shaped as shown in FIG. 2; and FIG. 6B shows a cell stage 20 having a stepwise tapered edge. The height of the sun varies with time during the day and also with seasons in a year. The cell stage having the stepwise tapered edge as shown in FIG. 6B is advantageous in that the influence of the seasonal variation in height of the sun is absorbed by using the stepped part 38 and trailing of the sun during a day is achieved by using the tapered section 36.

Alternately, it is possible to track the sun by using a particular cell stage 20 but not a position detection sensor 26. To be specific, since the sun moves constantly depending on a region and/or a season, use of a cell stage 20 which has a tapered part 36 and a stepped part 38 suit to such a peculiar movement, as well as use of stage driving bars 24x, 24y which have been pre-programmed to move in a predetermined manner, would enable tracking of the sun without using a position detection sensor 26.

In this embodiment, the cell stage 20 is driven by utilizing water for cooling the solar cells 16, instead of a motor. That is, no power is consumed to drive a motor. Having no need for power to drive a motor, which is normally considered to be 3 to 10% of all power generated, will contribute to increased efficiency in electricity generation by the solar cells 16.

In addition, water used to move the cell stage 20 is only in the region of 20 to 30 liters per day. This can be considered a small amount compared to a 500 liter to 1 m³ amount used to cool the solar cells 16. This fact is a major economic advantage of the driving method employed in this embodiment.

Moreover, there is no need to separately provide a tracking mechanism and cooling equipment since the stage driving bars 24x, 24y are driven by using cooling water. Also, employment of solar cells 16 which can be directly cooled by water enables a device of a simple structure wherein those cells 16 are simply placed so as to be drenched with water.

A movement extent of the cell stage 20 varies depending on the size and the focal distance of a converged lens 10 in use, the size of a solar cell 16, and a range for tracking the sun. Converging lenses 10 each being 40×40 mm square having a focal distance of 70 mm are arranged with no gaps between adjacent ones, and solar cells 16 each being a 5×5 mm square are used. To track the sun from 9 am to 3 pm, the cell stage 20 needs to be moved by approx. ±55 to 70 mm in the x direction and by approx. ±30 mm in the y direction, the y direction corresponding to a seasonal variation in height of the sun.

Figure 7:
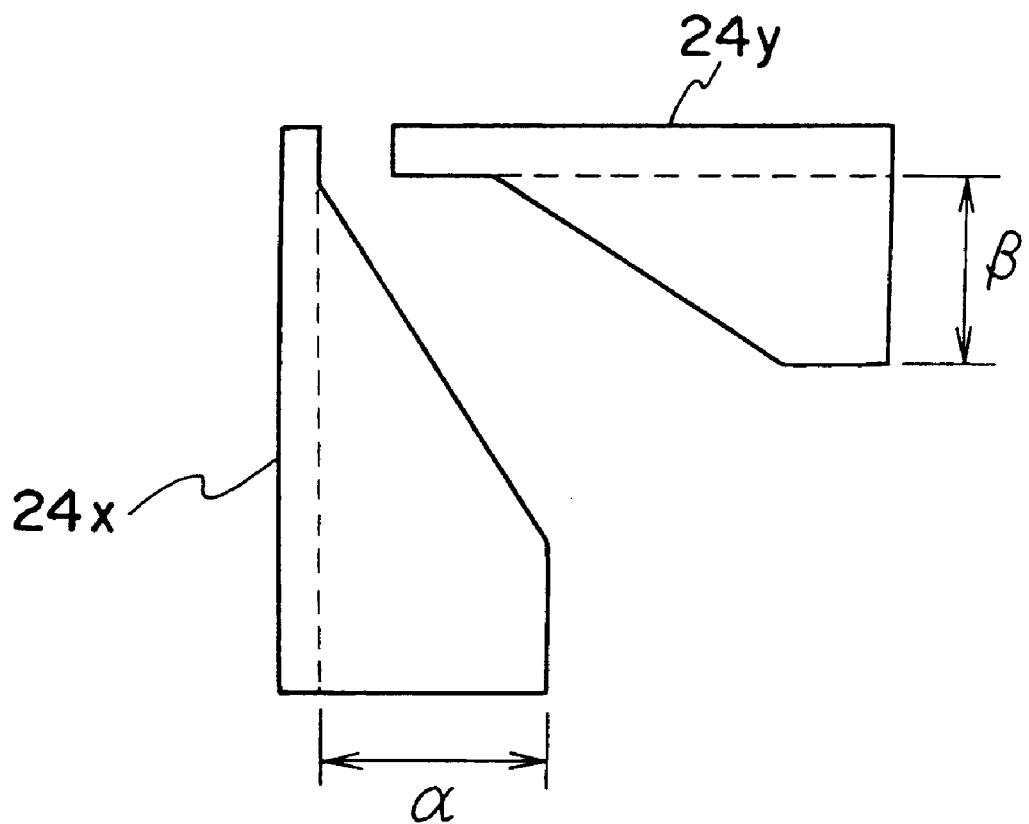
FIG. 7 is a diagram showing an example of a stage driving bar used in the embodiment shown in FIG. 1.

Research and experiments have proved that use of stage driving bars 24x, 24y shaped as shown in FIG. 7 could achieve the above tracking, wherein α should be 100 to 140 mm and β 60 mm.

Embodiment 2

Figure 8:
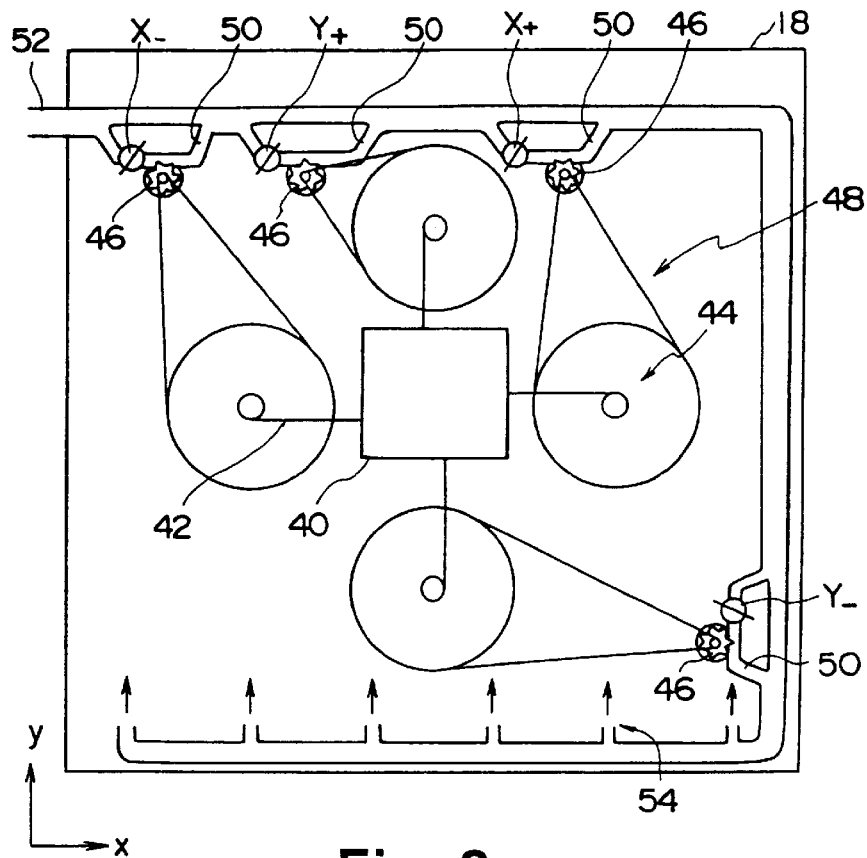
FIG. 8 is a diagram showing a structure of a converging solar module according to a second preferred embodiment of the present invention.

FIG. 8 is a diagram showing the structure of driving means used in a converging solar module according to this embodiment. A cell stage (not shown) is supported by a stage pedestal 40, which is in turn connected to pulleys 44 via cell driving wires 42 in four directions. A belt 48 is wound around each of the pulleys 44 and a corresponding waterwheel 46. In this embodiment, the stage pedestal 40, the cell driving wires 42, the pulleys 44, the waterwheels 46, and the belts 48 together constitute driving means of the present invention.

As shown in the drawing, four pulleys 44 are respectively provided in four driving directions and driven by four waterwheels 46. Rotating and stopping of the respective waterwheels 46 are controlled by opening/closing operations of the feeder valves X+, X− for moving the stage pedestal 40 in the x direction and of the feeder valves Y+, Y− for moving it in the y direction. A waterwheel 46 rotating causes a relevant pulley 44 to rotate, thereby winding up a corresponding cell driving wire 42 and resultantly moving the stage pedestal 40 in a predetermined direction.

A case will be described where the feeder valve X+ is opened. Water is poured into a bypass path 50 having the feeder valve X+, causing a relevant waterwheel 46 to rotate. The rotating waterwheel 46 in turn causes rotation of a corresponding pulley 44, so that the stage pedestal 40 is moved in the positive direction of the x axis. The cell pedestal 40 will be similarly moved in other directions as well.

Water used to rotate respective waterwheels 46 is supplied from a cooling water pipe 52 and poured via cooling water nozzles 54 formed thereon into the inside of the vessel 18 where the driving means as shown in FIG. 8 are accommodated, to be used to cool solar cells 16 (not shown).

Opening/closing of the feeder valves X+, X−, Y+, Y− is controlled using the same method as described in the first embodiment. That is, the position of the cell stage 20 is detected by the position detection sensor 26, and then controlled either such that a converged spot 14 is formed at the center of the sensor 26 or according to a pre-set program regarding the movement of the sun during a day or a year.

Note that the bypasses 50, which are provided to the cooling water pipe 52 in the above, may be provided separately from the cooling water pipe 52 and, for instance, tap water may be directly poured into the bypasses 50 to drive the waterwheels 46. Further, the bypasses 50 may be connected in parallel instead of serially as in FIG. 8.

Figure 9:
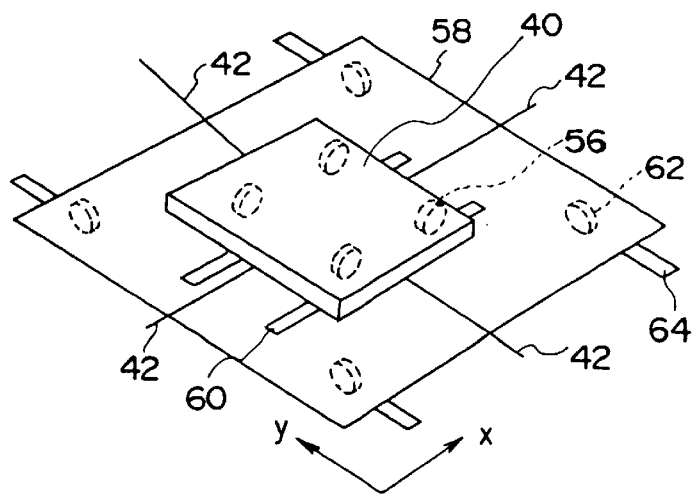
FIG. 9 is a diagram showing a structure of a stage pedestal used in the embodiment shown in FIG. 8.

FIG. 9 is a perspective view of the stage pedestal 40. Four wheels 56 are attached to the base surface of the stage pedestal 40, fitting into two slots 60 formed on a stage stand 58 and moving while rotating only in the direction of the slots 60.

Another four wheels 64 are attached to the base surface of the stage stand 58, fitting into two slots 64 formed on the base surface of the vessel 18 and moving while rotating only in the direction of the slots 64.

By pulling a cell driving wire 42 extending in the x direction in FIG. 9, the wheels 56 rotate in the slots 60, so that the stage pedestal 40 accordingly moves.

On the other hand, by pulling another cell driving wire 42 extending in the y direction, the wheels 56 do not rotate but stay abutting on the side edge of the slots 60 so that the stage pedestal 40 is moved in the y direction along with the stage stand 58 moving in the y direction with the wheels 62 rotating in the slots 64.

With this arrangement, the stage pedestal 40 is able to be translated in a desired direction by a relevant pulley 44 winding up a corresponding cell driving wire 42.

Note that the wheels 56, 62 used in the above, which can move only in one direction, may be replaced by casters attached to the base surface of the stage pedestal 40 for multi-directional movement.

Also, a cell stage 20 which is fixed to the stage pedestal 40 by predetermined means could be placed in water, and a converging solar module using such a cell stage 20 could be installed while being tilted. A converging solar module applicable to tilting installation is advantageous in that it can be easily installed on the roof of a house in a manner that the solar cells 16 face the direction of the sun. This ensures more efficient solar generation.

Besides fixing as above, a cell stage 20 sunk in water is obtained when it is made of material having higher relative density than that of water and placed on the stage pedestal 40.

Embodiment 3

Figure 10:
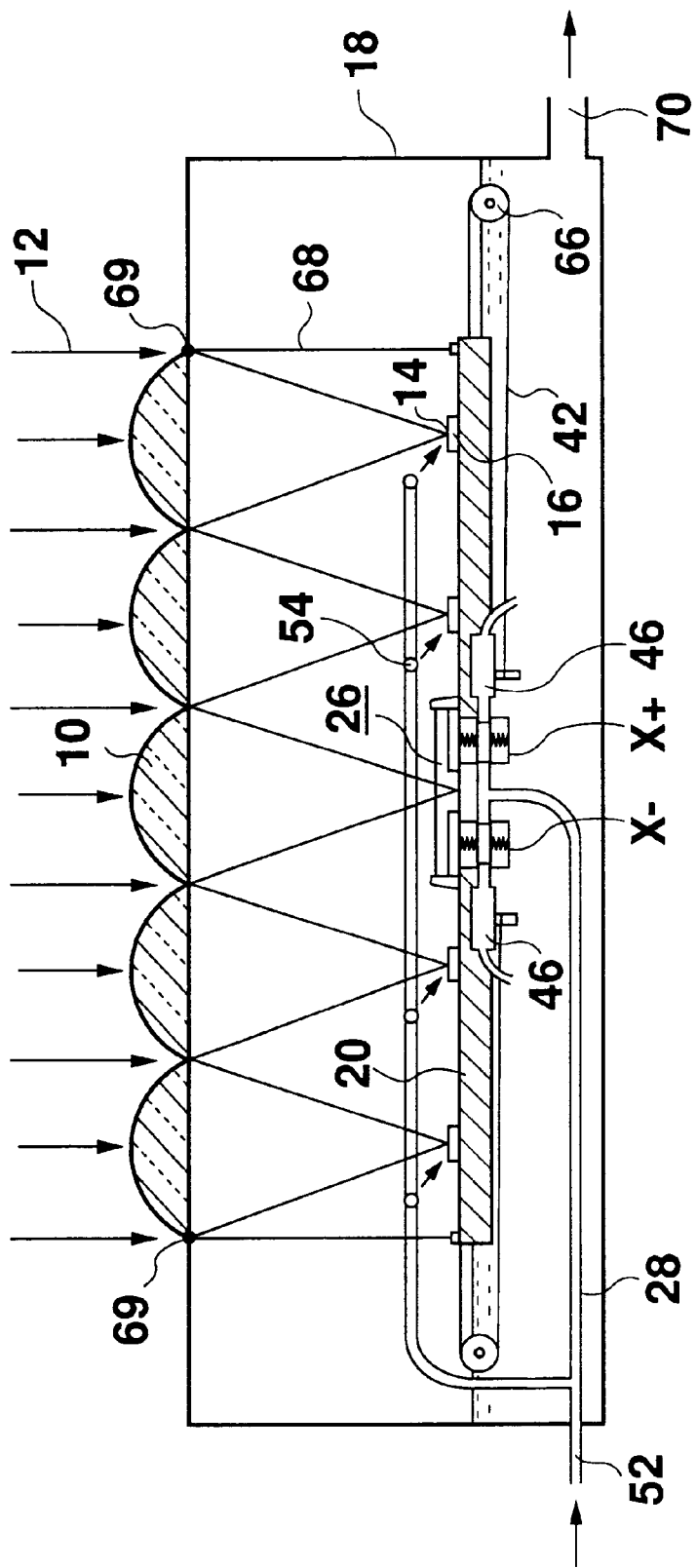
FIG. 10 is a cross sectional view of a converging solar module according to a third preferred embodiment of the present invention.

FIG. 10 is a cross sectional view of a solar module according to this embodiment. Converging lenses 10 are provided at the upper part of the vessel 18 so that sunlight 12 is converged through these lenses to form converged spots 14. Solar cells 16 are provided on the cell stage 20 such that the converged spots 14 are formed thereon.

Similar to the first embodiment, one of the solar cells 16 on the cell stage 20 is replaced by a position detection sensor 26 of the same type as shown in FIG. 4, wherein such a positional relationship is retained between the solar cells 16 and the sensor 26 that, when a converged spot 14 is formed on the center hole of the sensor 26, converged spots 14 are formed on the solar cells 16. The center hole of the sensor 26 is preferably as large as a solar cell 16. The position of the cell stage 20 is adjusted such that a converged spot 14 is formed on the center hole of the position detection sensor 26 so as to follow the trail of the sunlight, similar to the first embodiment.

In order to prevent excess heating by the sunlight, respective solar cells 16 are cooled by water squirted toward them via cooling water nozzles 54 from the cooling water pipe 52.

This cooling water pipe 52 is branched so that one of the branched pipe extends to the feeder valves X+, X− to pour water through them. If the position of a converged spot 14 is displaced toward one of the heat collecting panels of the position detection sensor 26, a feeder valve X+ or X− directly below that panel is opened so that cooling water is poured into a relevant waterwheel 46, which then starts rotating and thereby winding a relevant cell driving wire 42 via a corresponding pulley 66 to move the cell stage 20 horizontally in the direction of the converged spot 14 then formed.

Note that, only two feeder valves X+, X− are shown in FIG. 10, four feeder valves X+, X−, Y+, Y−, may be provided to move the cell stage 20 in both x and y directions, similar to the first embodiment.

The cell stage 20 may float on water, as shown in FIG. 10, or be hung via stage hanging wires 68 from the upper surface of the vessel 18, i.e., where converging lenses 10 are placed. For a hanging cell stage 20, when the cell stage 20 moves horizontally, the stage hanging wires 68 start a circular motion with a fulcrum 69 as a center, which allows vertical movement of the cell stage 20. As the sun moves, the point where converged spots 14 are formed accordingly move not only horizontally but also vertically. Therefore, such a hanging cell stage 20 is advantageous in that it can more accurately follow the trail of displacing converged spots 14 while moving vertically as well as horizontally.

Alternatively, the cell stage 20 may be sunk in water, similar to the first embodiment. In this structure, cooling nozzles 54 are unnecessary as the solar cells 16 themselves are sunk in water and cooled.

Water supplied in the vessel 18 is drained through a drain pipe 70 so that the water in the vessel remains at a constant level.

In this embodiment, the feeder valves X+, X−, the water wheels 46, and the pulleys 66 together constitute driving means of the present invention. The driving means may be provided for every cell stage 20 or, alternatively, only a single set of driving means may be provided to drive a plurality of cell stages 20 which generally constitute one converging solar module 20. With the latter structure, the numbers of feeder valves X+, X−, waterwheels 46, pulleys 66, and so on, and thus costs thereof can be reduced, and variation in accuracy for positional adjustment for those cell stages 20 can be reduced.

Instead of cooling water, tap water may be directly supplied to move the cell stage 20, similar to the first embodiment.

FIG. 11 is an enlarged cross sectional view of the feeder valves X+, X−. The sensors x+, x− of the position detection sensor 26 are heat collecting panels, under each of which a shape memory alloy spring 72 is installed. The spring 72 has a shielding valve 74 attached to the tip end thereof. The shielding valve 74 is attached on the other side to a stainless spring 76 and thereby urged downward so that the spring 72 and the spring 76 are balanced. In this embodiment, the shape memory alloy spring 72, the shielding valve 74, and the stainless spring 76 together constitute a shape memory alloy ON-OFF valve of the present invention.

Figures 11A, 11B:
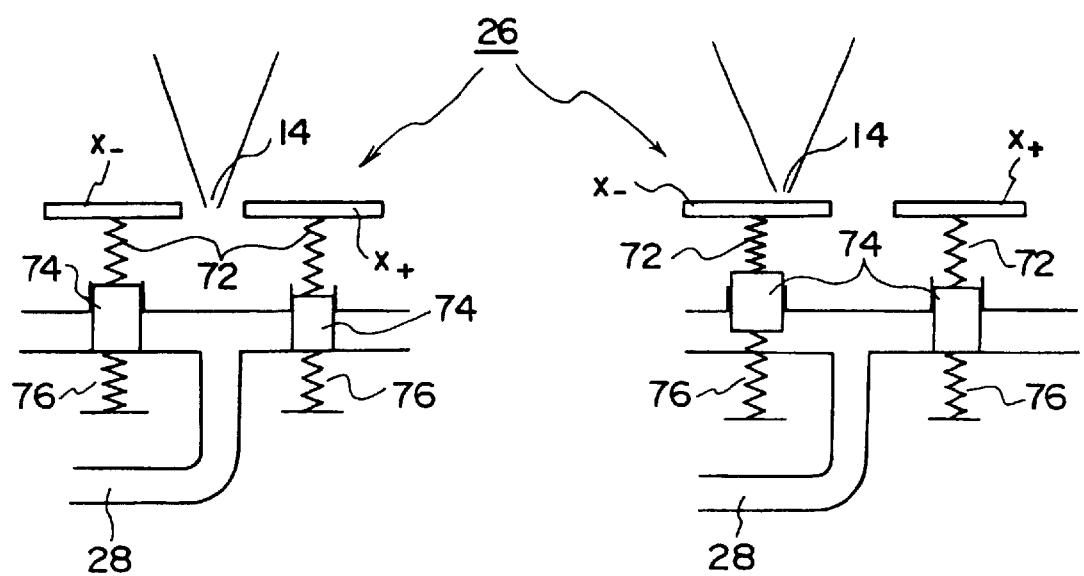
FIG. 11A is an enlarged cross sectional view of a feeder valve used in the embodiment shown in FIG. 10.
FIG. 11B is an enlarged cross sectional view of a feeder valve used in the embodiment shown in FIG. 10.

When a converged spot 14 falls on the center hole of the position detection sensor 26, as shown in FIG. 11A, no sunlight irradiates the sensors x+, x− which are made of heat collecting panels, and the temperature thereof thus does not increase. Then, the shielding valve 74 stays pulled by the stainless spring 76, shielding water supplied from the hydro-pressure pipe 28. Preferably, the center hole may be covered by a transparent or reflective member so as to prevent heat transmission to the sensors x+, x−.

On the other hand, when a converged spot 14 falls on one of the sensors, e.g., the sensor x−, as shown in FIG. 11B, the temperature of the sensor x− rises quickly up to 70 to 150° C. In turn, the temperature of a shape memory alloy spring 72 which is below the sensor x− and connected thereto similarly rises, so that the spring 72 is compressed by a force larger than a compression force of the stainless spring 76. As a result, the shielding valve 74 moves upward, as shown in FIG. 11, to be in a released state. Water from the hydro-pressure pipe 28 thus passes through the shielding valve 74 which is then in the released state and rotates a relevant waterwheel 46 (see FIG. 10). Thereafter, the rotating waterwheel 46 remotely winds up a relevant cell driving wire 42, whereby the cell stage 20 is moved in the direction of the converged spot 14. As described above, the shielding valve 74 switches hydro-pressure which acts on waterwheels 46 which constitute driving means.

When the cell stage 20 has moved in the direction of the converged spot 14 until the converged spot 14 again falls on the center hole of the position detection sensor 26, the temperatures of the sensor x− and the shape memory alloy spring 72 decrease, so that the shielding valve 74 is closed by the action of the stainless spring 76.

In the above structure, the temperature of the shape memory alloy spring 72 continues rising while a converged spot 14 is falling on the sensor x+, x−. However, it will not exceed 150° C. since heat is released via the shielding valve 74 into water in the pipe which extends to the waterwheels 46. As a result, deterioration of the spring 72 due to heat can be prevented.

Preferably, the position detection sensor 26 is as large as a converging lens 10 so that a converged spot 14 will definitely be formed somewhere on the sensors x+, x− of the sensor 26 no matter what direction sunlight 12 comes into the converging lens 10 at.

As described above, it is advantageous in terms of reliability and component lifetime to use a shape memory alloy spring 72 to drive a shielding valve 74. To be specific, provided that a shielding valve 74 is opened/closed at the frequency of once per fifteen minutes and operated for six hours a day. The total number of operations will total 24 times a day at the maximum, and approx. 5000 times in a year of 200 working days. Since a memory shape alloy spring 72 is generally tolerable to 70 to 100 thousand normal operations, a memory shape alloy spring 72 is theoretically operable without trouble for 15 to 20 years under the above conditions.

Figure 12:
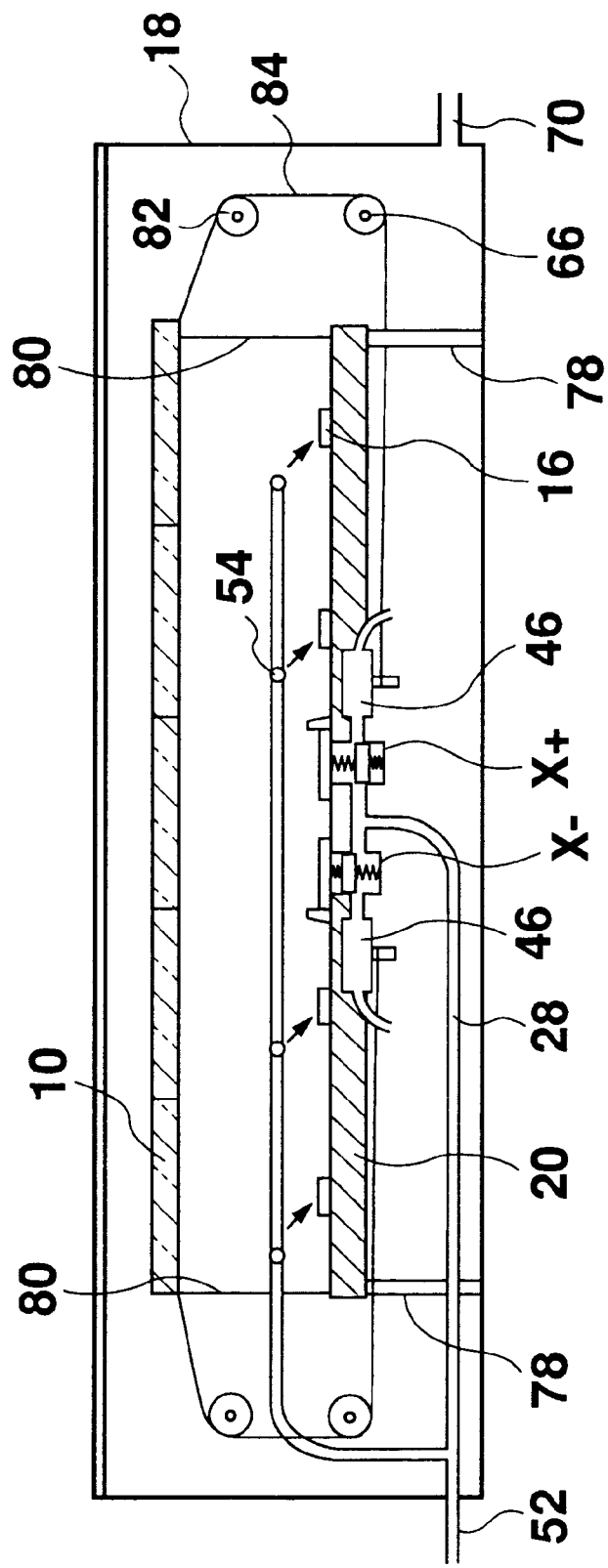
FIG. 12 is a cross sectional view of a modified example of a converging solar module according to the third preferred embodiment of the present invention.

FIG. 12 is a diagram showing a modified example of the solar module according to this embodiment, in which identical members to those in FIG. 10 are given the same reference numerals and their explanations are omitted.

This modification is characterized by that the converging lenses 10, instead of the cell stage 20, are moved according to the movement of converged spots 14.

For converging lenses 10 comprising heavy convex lenses, and so on, it is easier to move a cell stage 20. However, converging lenses 10 comprising, for example, Fresnel lenses of resin having a very light weight, can be more easily moved than a cell stage 20.

In the drawing, the cell stage 20 is fixed to the base surface of the vessel 18 by means of fixing bars 78, while the converging lenses 10 are supported by supporter bars 80 on the cell stage 20.

The converging lenses 10 are moved in the same manner as that in the example shown in FIG. 10, in which the waterwheels 46 are rotated due to opening/closing of the feeder valves X+, X−, thereby winding up via pulleys 66, 82 the lens driver wires 84 connected to the converging lenses 10. The converging lenses 10 and the supporter bars 80 are connected via a hinge, leaving the former freedom to move.

Figure 13:
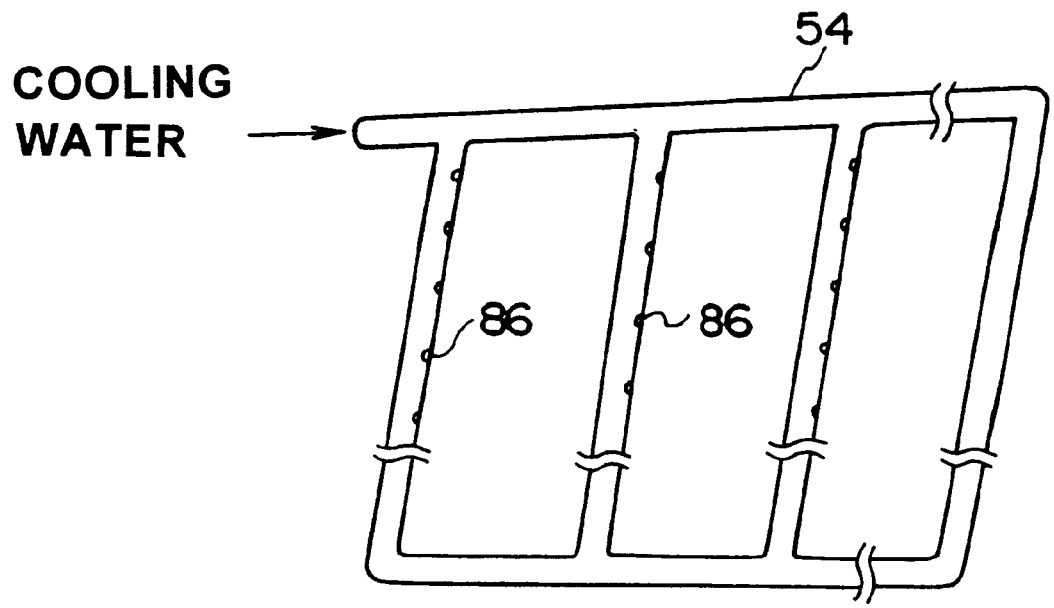
FIG. 13 is a diagram showing a cooling water nozzle used in the embodiment shown in FIGS. 10 and 12.

FIG. 13 is a diagram showing a cooling water nozzle 54 used in this embodiment. This nozzle 54 is made of, for instance, a stainless steel or aluminum tube having an external diameter of 3 to 6 mm and an internal diameter of 2 to 4 mm. Water supplied through a cooling water pipe 52 (not shown) is squirted towards the solar cells 16 on the cell stage 20 via nozzle holes 86 formed on the cooling water nozzle 54. The shape of the cooling water nozzle 54 is not limited to that shown in FIG. 13, and may be any desired shape which allows reliable squirting of cooling water toward the solar cells 16.

Embodiment 4

FIG. 14 is a cross sectional view of a converging solar module according to this embodiment. The structure shown in this drawing is characterized by the fact that the entire module is tilted, assuming a case that the module is installed on the roof of a house. The cell stage 20 sinks in the cooling water 88 contained in the vessel 18, and is subject to positional control as it is sunk using the same methods described in Embodiments 1, 2, and 3 according to variation of the positions of converged spots.

The solar cells 16, also sunk in the water 88, have been subjected to predetermined waterproof processing, similar to Embodiments 1, 2, and 3.

Cooling water 88 is supplied from the cooling water pipe 52 via a backward flow prevention valve 90 into the vessel 18, and drained via the drain pipe 70. That is, cooling water 88 flows from the lower part to the upper part of the vessel 18 tilting, filling the vessel 18 all the time. Since the supplied cooling water is drained at the upper part of the vessel 18, which has by then become warm, the solar cells 16 are always cooled with cooler water 88. This increases cooling effects on the solar cells 16.

With supplying water 88 stopped, the backward flow prevention valve 90 is forced to be closed due to the weight of the cooling water 88 itself, thereby preventing cooling water from pouring out via the vessel 18. With this arrangement, water inside the vessel 18 is held as it is by the backward flow prevention valve 90 being closed even when supply of cooling water 88 should be stopped due to some problem with the cooling water pipe 52 and so on.

Figures 14A, 14B:
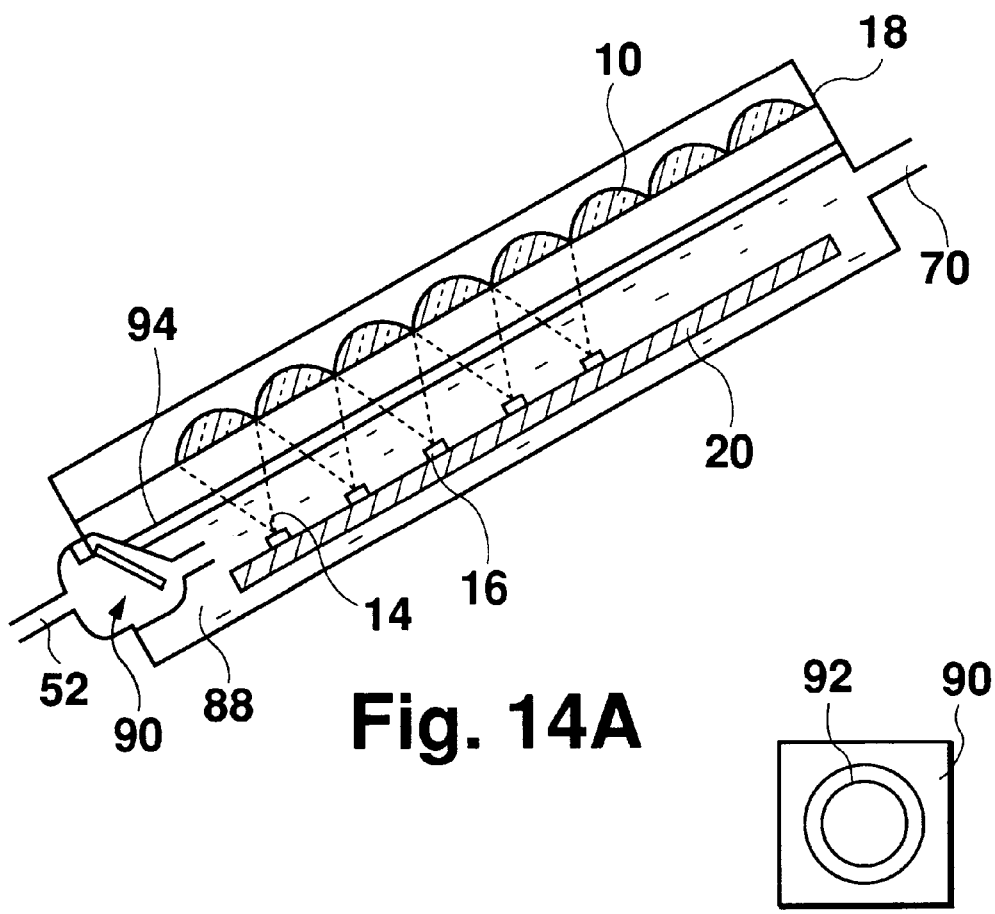
FIG. 14A is a cross sectional view of a converging solar module according to a fourth preferred embodiment of the present invention.
FIG. 14B is a front view showing an O-ring for sealing according to the fourth preferred embodiment of the present invention.

A rubber O ring 92, and such like, attached to the backward flow prevention valve 90, as shown in FIG. 14B, would further enhance the sealing performance.

Also, a swelling valve (not shown) provided to either the vassal 18 or the drain pipe 70 could absorb increased vapor pressure when the cooling water 88 becomes warmer in the vessel 18 due to the sunlight. This is effective in preventing leaking water due to increased pressure inside the vessel 18.

In addition, it is preferable to install a glass plate 94 in between the converging lenses 10 and the cell stage 20, as shown in FIG. 14A, so that the total weight of the device is reduced with a lower amount of cooling water 88 in the vessel 18.

With the above arrangement, excessive heating of the solar cells 16 and resultant damages thereof can be prevented thanks to the cooling water 88 held in the vessel 18 even if supply of water is stopped for some reason while the converging solar module is operated.

In order to confirm the advantage assumed to be obtained by this embodiment, an experiment is performed using a cell stage 20 of 1 m$^2$ and a glass plate 94 installed to define the depth of a water layer to be 3 mm thick, in which the converging lenses 10 are irradiated with light while a cooling water pump is out of operation.

In this experiment, assuming one summer month, light of 1 kW/m$^2$ is kept irradiating the lenses 10 for 12 hours, followed by absence of irradiation for 12 hours, and this whole process is repeated thirty times. The ambient temperature is set at 30° C. As a result, the temperature of the cooling water 88 in the vessel 18 rose up to 73° C. but no further due to heat released to outside the vessel 18. The lost amount of cooling water 88 is 30 cc, which is sufficiently small to leave the uppermost solar cell 16 attached to the tilting cell stage 20 fully buried in the cooling water 88.

The converging rate is set at 100 times in this experiment. The temperature of the solar cells 16 rose up to 118° C. when the cooling water 88 was at 73° C. Although the electricity generation performance of the solar cells 16 at such a high temperature was deteriorated, no damage thereof due to heating was recognized and they were able to resume normal operations as soon as supplying cooling water was resumed.

Embodiment 5

FIG. 15 is a diagram explaining the operation of a converging solar module according to this preferred embodiment, in which identical members to those in Embodiment 3 are given the same reference numerals and their descriptions are omitted.

The structure relative to the third embodiment employed a squirting cooling method using a cooling water nozzle shown in FIG. 13, and therewith increased cooling efficiency. Embodiment 5 relates to a mechanism for protecting solar cells 16 when squirting of cooling water is stopped in such a structure.

Figure 15A:
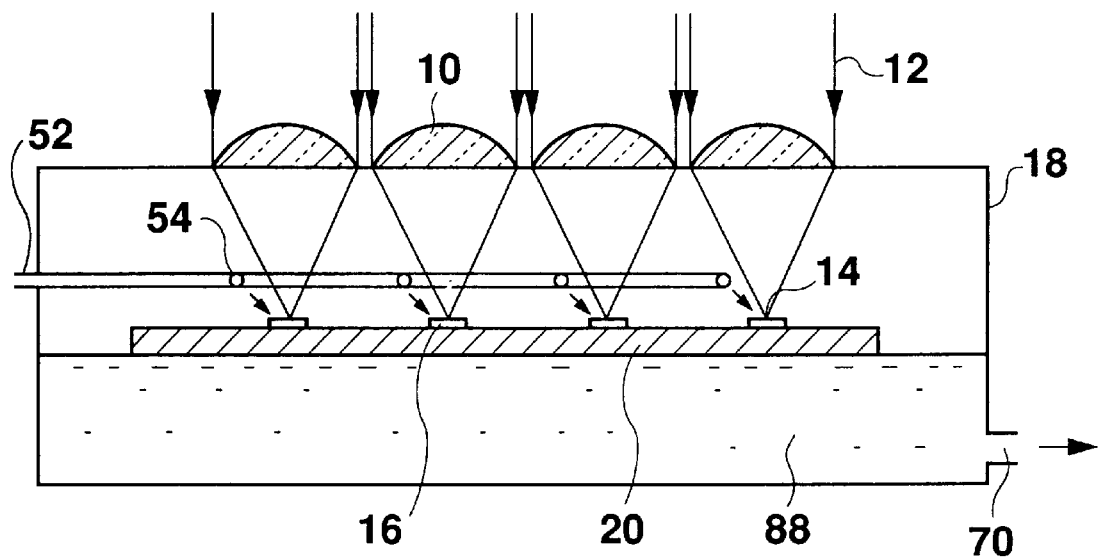
FIG. 15A is a cross sectional view of a converging solar module according to a fifth preferred embodiment of the present invention.

Referring to FIG. 15A, the cell stage 20, made of resin to have a light relative density, floats on the cooling water 88, and water is further squirted towards the solar cells 16 on the cell stage 20 from the cooling water nozzle 54 which is movable along with the cell stage 20. The squirted water 88 is held in the vessel 18 so that the cell stage 20 floats thereon. The position of the cell stage 20 is adjusted while it floats, using the same methods described in Embodiments 1 and 3 such that converged spots 14 are caused to fall on the solar cells 16.

The converged rate is set in the range from a few ten (around 20 or 30) times to 100 times since the area of each solar cell 16 is around $1/10$ to $1/1000$ times in size of each converging lens 10.

The same amount of water is squirted from the nozzle 54 and drained from the drain pipe 70 so that the water in the vessel 18 is kept at a constant depth, which is from half of to the same as the focal distance of the converging lens 10 in use.

Figure 15B:
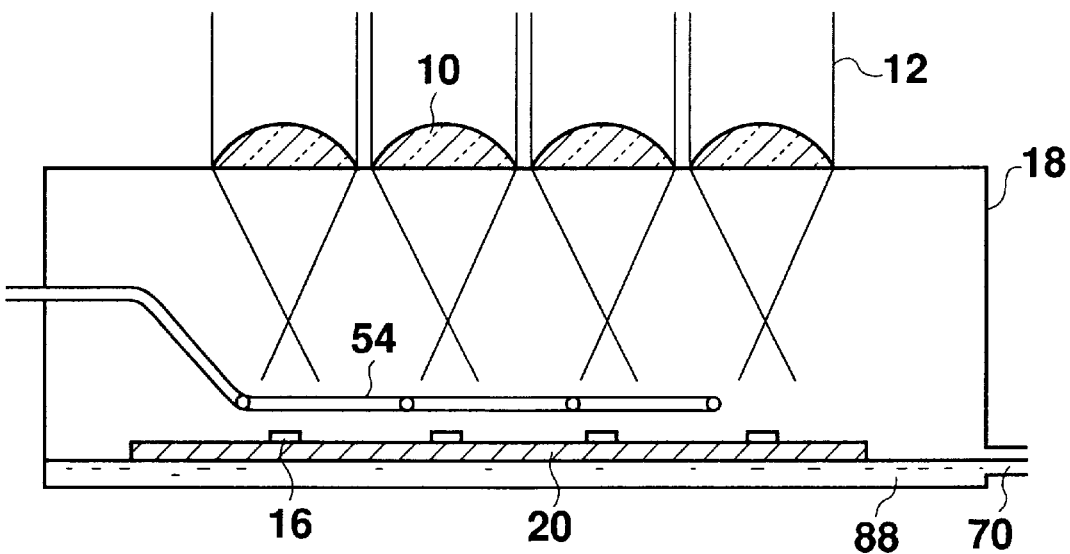
FIG. 15B is a cross sectional view of a converging solar module according to the fifth preferred embodiment of the present invention.

If the squirting should be halted due to some problem, the water level in the vessel 18 will lower with continuously draining water from the drain pipe 70. This leads to the situation as shown in FIG. 15B, in which the cell stage 20 has been lowered below the position of the focal points of the converging lenses 10. The converged rate of the sunlight irradiating the solar cells 16 has then dropped to less than ten times, and the temperature of the solar cells 16 thus increases at a lower rate, so that the solar cells 16 become around 100° C. at most even without being cooled by squirted water from the cooling water nozzle 54.

In other words, with this structure, even if water squirting is stopped, the solar cells 16 will not be damaged due to excessive heating by the sunlight 12 because the converged rate of the sunlight 12 irradiating the solar cells 16 drops because of the cell stage 20 descending according to the lowering water level in the vessel 18.

Figure 16:
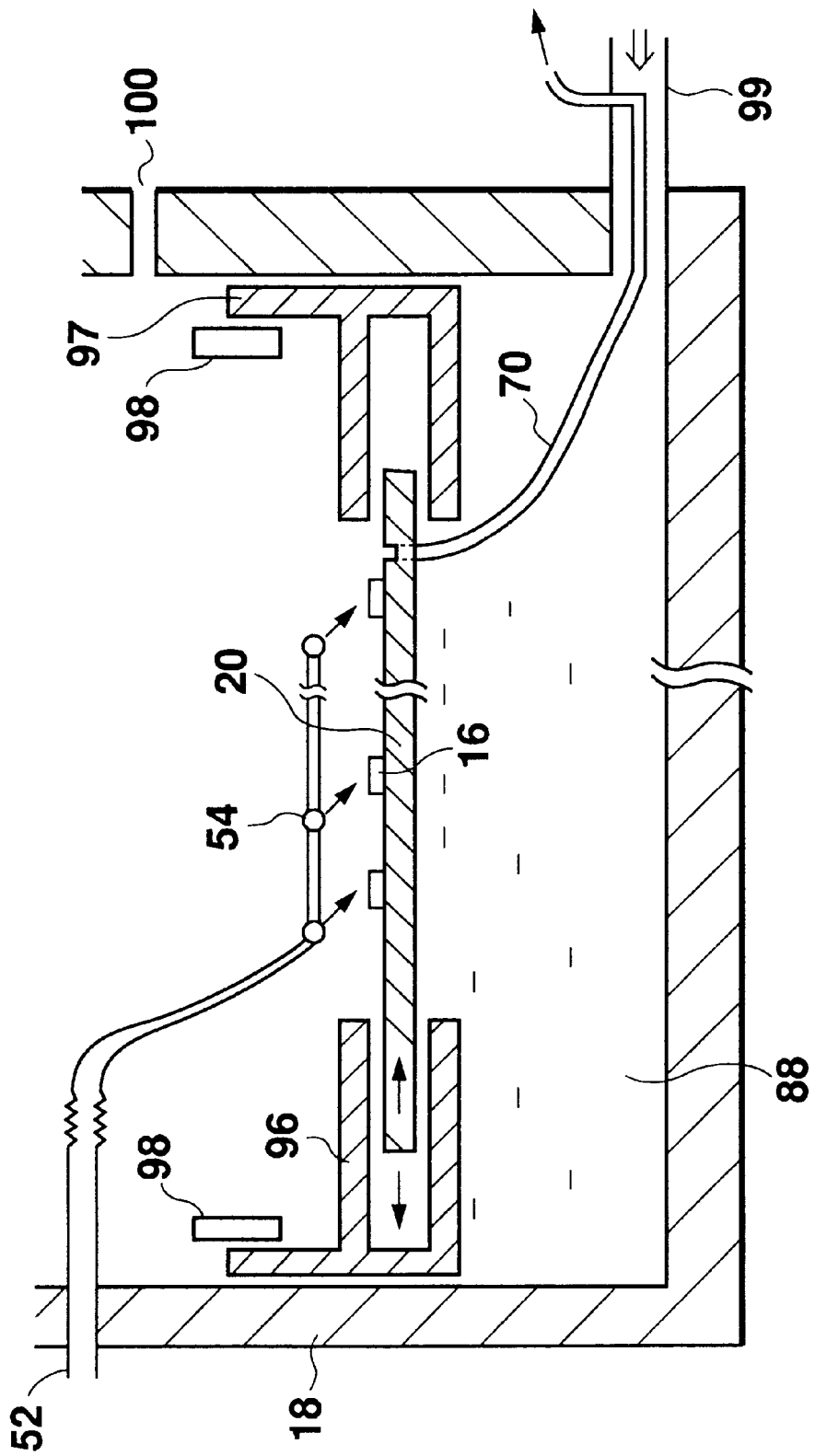
FIG. 16 is a cross sectional view of a modified example of a converging solar module according to the fifth preferred embodiment of the present invention.

FIG. 16 is a diagram showing a modified example of the converging solar module according to this embodiment. The cell stage 20 is supported by a stage pedestal member 96 in such a manner that it is sandwiched by two plates and left slidable in the horizontal direction of the drawing. The stage pedestal member 96 has a rear plate part 97 which extends upward in the drawing and is inserted in between the side wall of the vessel 18 and a pressing plate 98 so that the member 96 can move vertically with guidance by the pressing plate 98, while contacting the sidewall of the vessel 18.

Note that the stage pedestal member 96 is also made of resin so as to be light enough to float on the cooling water 88.

With water poured into the vessel 18 from the water level adjustment pipe 99, the water level in the vessel 18 varies accordingly, whereby the cell stage 20 and the stage pedestal member 96 floating thereon move vertically. In general, the water level is maintained such that converged spots 14 are formed on the solar cells 16.

Similar to the example of FIG. 15, excessive heating of the solar cells 16 is prevented using cooling water squirted toward them from the cooling water nozzle 54 and then drained via the drain pipe 70 to the outside.

In this embodiment, cooling water in the vessel 18 is drained through the water level adjustment pipe 99 in the case that water squirting should be halted due to some problem. Whether or not water supplying from the cooling water pipe 52 to the cooling water nozzle 54 is stopped is detected by, for instance, a fluid velocity sensor (not shown) provided to the pipe 52. Upon detection of stopped supply, the cooling water 88 in the vessel 18 will start being drained via, for instance, an urgent drain valve (not shown) provided to the water level adjustment pipe 99.

With this structure, the cooling water 88 flows out from the vessel 18 through the water level adjustment pipe 99 when supply of cooling water is stopped. Resultantly, the cell stage 20 descends, together with the stage pedestal member 96, so that excessive heating of the solar cells 16 is prevented using the same principle described in FIGS. 15A and 15B. Note that an air intake hole 100 may be preferably formed on the side wall of the vessel 18 in order to promote draining of cooling water 88 via the water level adjustment pipe 99.

A modified converging solar module as shown in FIG. 16 is suitable for installation on the roof of a house as it is tolerable to tilting installation thanks to the cell stage 20 held by being sandwiched by the stage pedestal member 96.

Figure 17:
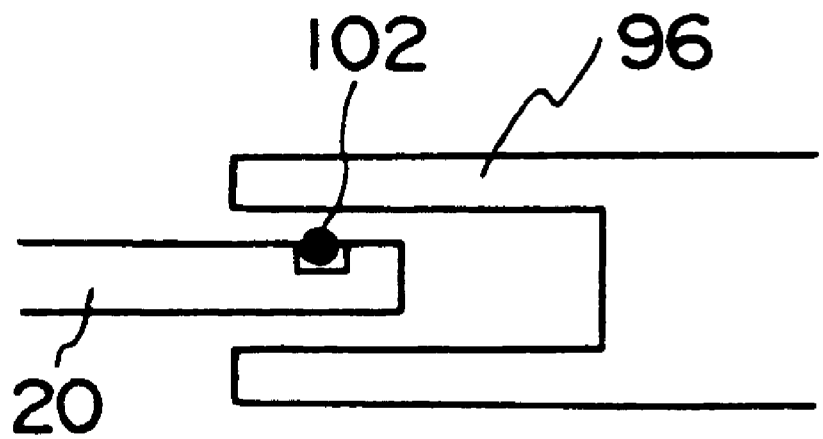
FIG. 17 is a cross sectional diagram showing the positional relationship between a stage pedestal member and a cell stage used in the embodiment shown in FIG. 16.

FIG. 17 is a diagram showing another example of a cell stage 20 held by a stage pedestal member 96. Different from the structure of FIG. 16, the cell stage 20 and the stage pedestal member 96 are made of material having a higher relative density than water. Moreover, a sealing O ring 102 provided to seal between the cell stage 20 and the stage pedestal member 96 effectively prevents cooling water 88 from coming onto the upper surface of the cell stage 88.

In general use, the cooling water 88 in the vessel 18 is pressurized to a predetermined pressure via the water level adjustment pipe 99, so that the cell stage 20 is lifted by this hydro-pressure to float on the water. In this event, no water is allowed to come onto the upper surface, i.e., the surface where the solar cells 16 are arranged, of the cell stage 20 thanks to the O ring 102.

Once the water level is adjusted to remain such that the height of the solar cells 16 is the same as that of the position where converged spots 14 are formed, the horizontal position of the cell stage 20 can be adjusted using the same method described for FIG. 15 so as to track displacing converged spots 14.

In this example, applying pressure via the water level adjustment pipe 99 is stopped in the case that water supplying from the cooling water pipe 52 should be stopped for some reason. With this arrangement, the cell stage 20 and the stage pedestal member 96 start sinking gradually into the cooling water 88 in the vessel 18, so that the solar cells 16 on the cell stage 20 move away from the focal points of the converging lenses 10. At the same time, the solar cells 16 are cooled by the cooling water 88 which has by then intruded onto the upper surface of the cell stage 20, so that excessive heating the solar cells 16 can be prevented.

Embodiment 6

Figure 18:
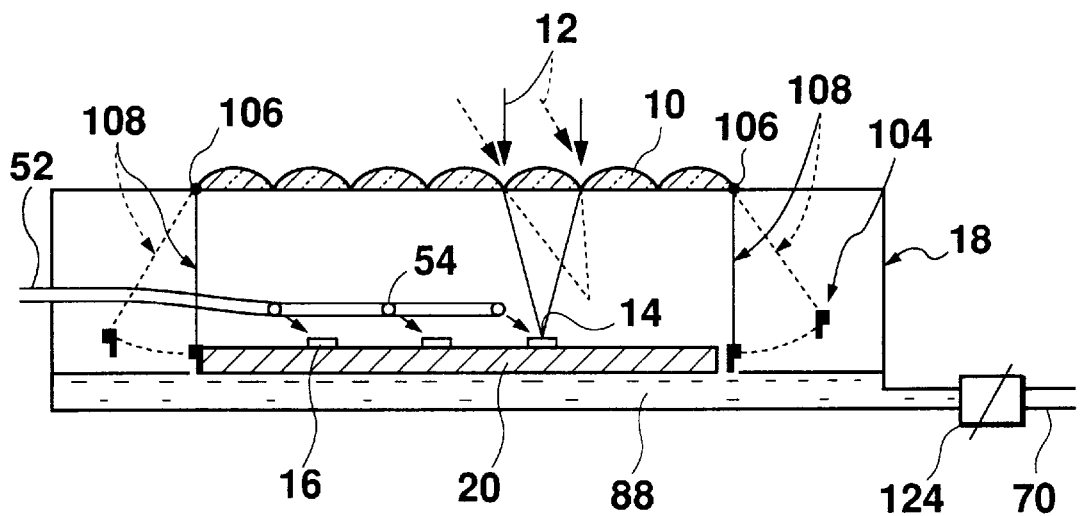
FIG. 18 is a cross sectional view of a converging solar module according to a sixth preferred embodiment of the present invention.

FIG. 18 is a cross sectional view of a solar module according to this embodiment, wherein identical members as those in the aforementioned embodiments are given the same reference numerals and explanations thereof omitted. The cell stage 20 floats on the cooling water 88 in the vessel 18, and is moved horizontally using the same method described in Embodiments 1, 2, and 3 to track the sun.

Similar to the third embodiment, the solar cells 16 on the cell stage 20 are cooled by cooling water squirted from the cooling water nozzle 54. Alternatively, water may be poured from a cooling water pipe (not shown) onto the entire surface of the cell stag 20 to cool the solar cells 16.

Here, it should be noted that converged spots 14 are formed in positions that are different not only horizontally but also vertically between the sunlight coming into the converging lenses directly from above (indicated by solid lines in the drawing), and sunlight coming in diagonally (indicated by broken lines) Therefore, even if the water level is properly adjusted for the perpendicular sunlight such that the height of the solar cells 16 on the cell stage 20 floating on the water 88 coincides with that of the converged spots 14 then formed, the heights of the former and the latter will come to be displaced from each other as the sun moves till the sunlight comes into the converging lenses 10 diagonally. Then, the converging rate of the sunlight 12 irradiating the solar cells 16 drops to generate less electricity.

Given that a converging rate is set to 100 times for the perpendicular sunlight 12, it will drop to 50 to 80 times for the sunlight 12 coming into the lenses 10 with an angle of 30° inclination with respect to the perpendicular direction to the lenses 10, and further to two to seven times for an angle of 45°. In short, the larger incident angle with respect to the perpendicular direction to the lenses 10 results in a lower utility rate of solar energy.

In this embodiment, not only horizontal but also vertical positions of the solar cells 16 are adjusted to coincide to those of the then formed converged spots 14. This is achieved by adjusting the level of cooling water 88 in the vessel 18 when the cell stage 20 moves horizontally, whereby the height of the cell stage 20 floating on the cooling water 88 is adjusted.

In order to detect the level of the cooling water 88, a level sensor 104 is hung from the fulcrum 106 on the lens surface via a pendulum wire 108 made of such material that is not bent or distorted, e.g., an iron wire or a resin plate. The pendulum wire 108 should be as long as the focal distance of the converging lens 10 in use. The level sensor 104, for which an electrode level sensor, a floating level sensor, and such like, may be used, is constructed so as to be turned on when it detects the cooling water 88 level.

Figure 19:
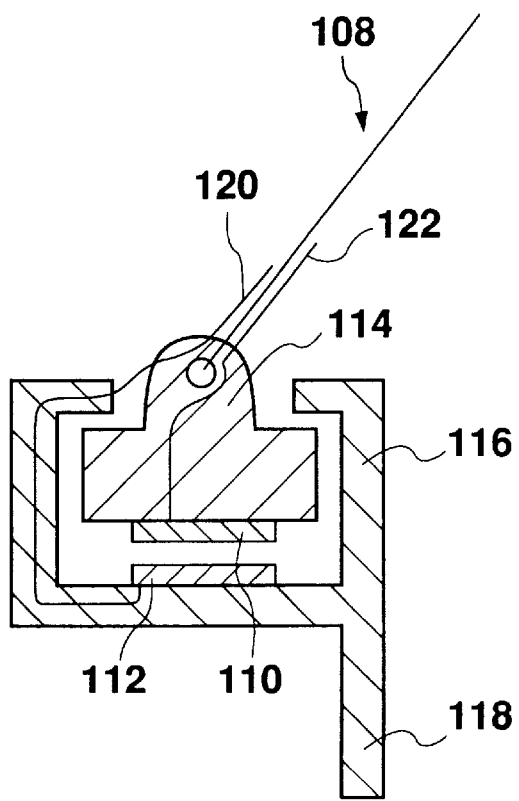
FIG. 19 is a diagram showing an example of a level sensor used in the embodiment shown in FIG. 18.

FIG. 19 is a diagram showing a floating level sensor having two electrodes 110, 112 attached to a core 114 and a housing 116, respectively. The housing 116, made of lighter material than water, has a leg part 18 on the side thereof contacting the cell stage 20 so that the contact is therewith ensured. The one shown in FIG. 19 contacts the cell stage 20 on its right side. The electrodes 110 and 112 are connected to leader lines 120, 122, respectively, which extend to the outside of the housing 116 along the pendulum wire 108.

When the water level is lower than the level sensor 104, the housing 116 descends due to its own weight, whereby the electrodes 110, 112 are moved apart from each other and the switch (of the sensor 104) is thus turned off. On the other hand, as the water lever increases, lifting up the housing 16 which is lighter than water, the electrodes 110, 112 are moved closer together until they contact each other, whereby the switch is turned on.

The drain pipe 70 in FIG. 18 is provided with a drain valve 124 via which water is drained to be then squirted from the cooling water nozzle 54. However, only a slightly smaller amount of water than that has been drained is to be squirted.

In the above structure, as already described, positions of the solar cells 16 and of converged spots 14 which have been adjusted to coincide to each other for the sunlight 12 coming into the converging lenses 10 directly from above (indicated by solid lines in the drawing) come to be displaced from each other as the sun moves with time till the sunlight 12 comes into the lenses 10 diagonally (indicated by broken lines). Thus, the horizontal position of the cell stage 20 is adjusted, following the trail of the sun, using the methods described in the aforementioned embodiments. The cell stage 20 which has moved horizontally in turn pushes the level sensor 104 up in the horizontal direction so that the level sensor 104, which is hanging via a pendulum wire 108, starts a circular motion with the fulcrum 106 as a center, thereby moving vertically.

When the level sensor 104 has been lifted higher than the cooling water 88 level due to the circular motion after horizontal movement of the cell stage 20, the level sensor 104 is turned off. Upon this, the drain valve 124 is closed so that the water level in the vessel 18 thereafter increases with water continuously supplied from the cooling water 88 nozzle 54.

With the pendulum wire 108 as long as the focal distance of the lens 10, to whatever position the level sensor 104 has moved, the height of the upper surface of the level sensor 104 is always equal to that of the focal point. Therefore, with a structure wherein the level sensor 104 is turned on when the water level is such that the height of the light receiving surfaces of the solar cells 16 is equal to that of the upper surface of the level sensor 104, the drain valve 124 is thereupon opened. The cell stage 20 stops rising when the solar stage 20 floating on the cooling water 88 has been lifted to the point where the height of the solar cells is equal to that of then formed converged spots 14, since the drain valve 124 is then opened. Note that the horizontal position of the solar cell 16 at that point coincides with that of converged spots 14.

Since a slightly larger amount of water is drained via the drain valve 124 than that to be supplied, continuation of water draining would result in gradual descending of the level of the floating cell stage 20. However, in the above arrangement, once the water level has been lowered by a predetermined level, the drain valve 124 is closed due to the level sensor 104 then turned off, causing the water level to resume increasing. These processes are repeated until the height of the solar cell comes to coincide with that of the converged spots 14.

As described above, in this embodiment, not only horizontal but also vertical positions of the cell stage 20 can be adjusted through repetition of opening/closing operations of the drain valve 124 until the solar cells 16 are caused to be positioned where converged spots 14 are formed.

In this embodiment, the timing of turning on/off of the level sensor 104, i.e., that of opening/closing of the drain valve 124, is determined according to the balance between water amounts to be supplied and to be drained. Preferably, such processes are set to be performed for every few minutes to half an hour or so. Also, when the water level needs to be decreased, for instance, in the morning when the sun rises gradually, a slightly larger amount of water is set to be drained via the drain valve 124 than that to be supplied. This setting enables gradual descending of the level of the cooling water 88 without adjusting the amount of supplying water. Therefore, provision of an extra level sensor for adjusting the amount of supplying water 104 is unnecessary, and this enables easy control over the height of the solar cell 16.

Figure 20:
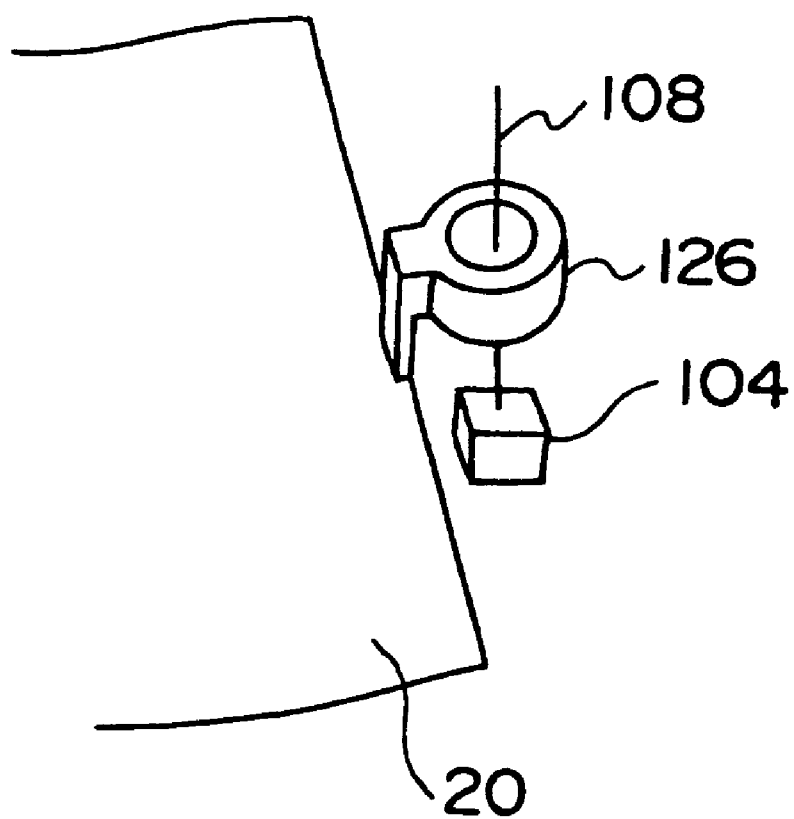
FIG. 20 is a diagram showing an example of a floating level sensor used in the embodiment shown in FIG. 19.

FIG. 20 is a diagram showing another example of a level sensor 104. The pendulum wire 108 suspending the level sensor 104 passes through a cylindrical support 126 which is secured to the edge of the cell stage 20. The level sensor 104 is hung so as to be positioned at the same level as that of the cell stage 20. The inner diameter of the support 126 is properly adjusted so that the pendulum wire 108 is not stuck, but at the same time, with sufficient caution that it is not made so large that the followability of the level sensor 104 is deteriorated. The pendulum wire 108 is made of a flexible member.

With the above, when the cell stage 20 moves horizontally following the movement of the sun, the height of the level sensor 104 hanging via the pendulum wire 108 is accordingly varied, so that the electrodes are brought into contact or pulled apart with respect to each other, similarly to the example relative to FIG. 19. This causes the drain valve 124 to close/open to thereby control the level of the cooling water 88 in the vessel 18. With this adjustment, the cell stage 20 floating on the cooling water 88 can be brought to the same level as that of the level sensor 104. Therefore, once a positional relationship concerning height between the level sensor 104 and the solar cells 16 is determined in which converged spots 14 are formed on the solar cells 16 where the level sensor 104 is located, the solar cells 16 can always be controlled to be located where converged spots 14 are formed no matter what incident angle the sunlight comes into the converging lens 10 at, by attempting to maintain that positional relationship.

Note that in order to instantly increase the rising speed of the cell stage 20, an additional pipe to the cooling water nozzle 54, is preferably provided in FIG. 18 to supply water directly from the cooling water pipe 52.

Figure 21:
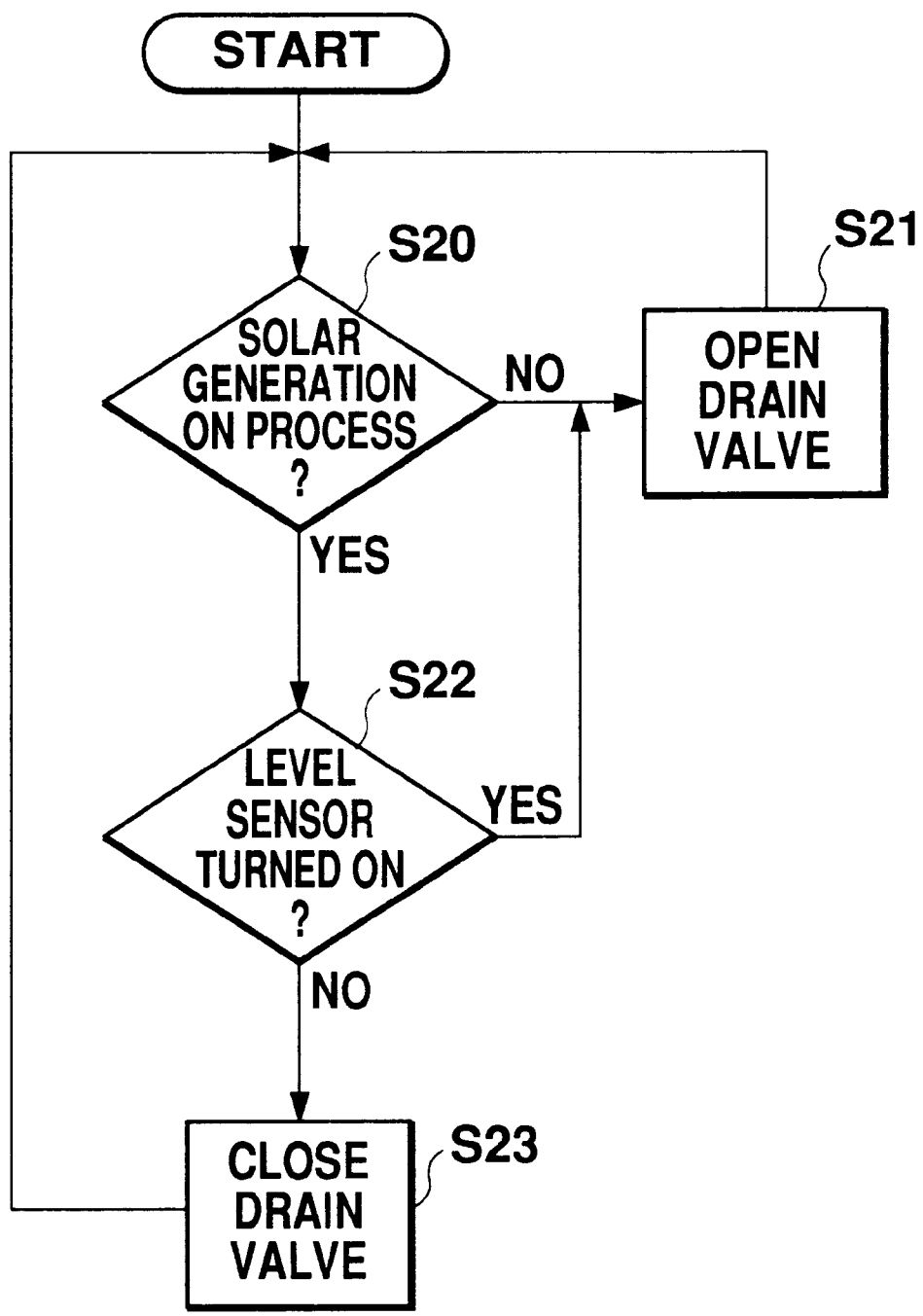
FIG. 21 is a flowchart of controlling the height of a cell stage used in the embodiment shown in FIG. 18.

FIG. 21 is a flowchart of controlling the height of the cell stage 20 shown in FIG. 18. Initially, whether or not solar electricity generation is in process is detected (S20). If not, the drain valve 124 is always kept open (S21).

If solar electricity generation is processing (S20), whether or not the level sensor 104 is turned-on is detected (S22).

If the level sensor 104 is detected as being turned-on, which means the water level is increasing, the drain valve 124 is opened (S21). On the other hand, for a turned-off level sensor 104 (S22), that means a low cooling water 88 level, the drain valve 124 is closed (S23).

With the above, the height of the cell stage 20 is adjusted.

In this embodiment, a converging rate as high as 80 to 95 times can be secured even for an incident angle inclined by 30° from the perpendicular direction to the converging lens 10, and moreover 40 to 60 times for a 45° inclination. Therefore, a sufficient amount of electricity can be generated using the solar cells 16 even with the sunlight 12 having a large incident angle.

In this embodiment, the cell stage is moved not only in horizontal but also vertical direction. When the horizontal movement is adjusted using the method described in the second embodiment, the cell stage 20, which is simply placed on the stage pedestal 40, may float away from the stage pedestal 90 as the level of the cooling water 88 increases, so that horizontal positional adjustment becomes out of control.

Figure 22:
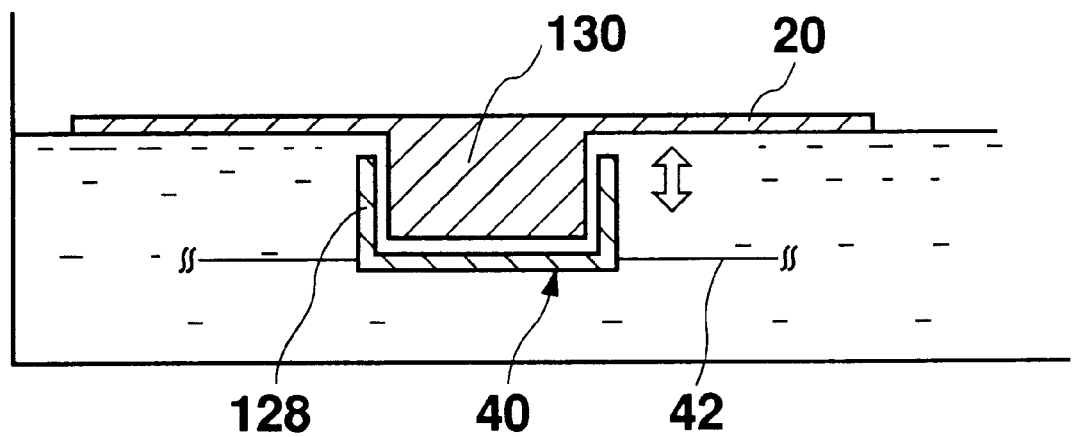
FIG. 22 is a diagram showing the positional relationship between a cell stage and a stage pedestal used in the embodiment shown in FIG. 18.

In order to prevent this problem, the structure as shown in FIG. 22 is employed so that horizontal movement can always be controlled irrespective of vertical movement of the cell stage 20. In FIG. 22, a stage pedestal 40 is formed to have a concave cross section, while the cell stage 20 has a projection 130. The projection 130 is loosely fit into the concavity 128 so that the cell stage 20 can freely move up or down inside the concavity 128.

With this structure, when the stage pedestal 40 is drawn by the cell driving wire 42 and thus moves in the horizontal direction, the cell stage 20 also moves in the same direction. In this event, even if the cell stage is lifted as the level of the cooling water 88 increases, controls over the horizontal position of the cell stage 20 remain effective as the projection 130 stays fitted into the concavity 128.

Figure 23:
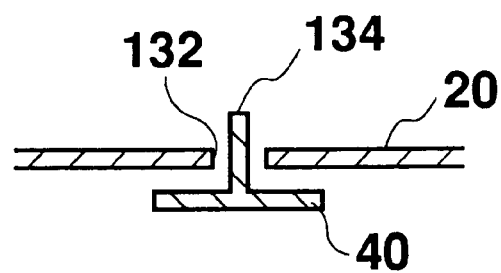
FIG. 23 is a diagram showing the positional relationship between a cell stage and a stage pedestal used in the embodiment shown in FIG. 18.
Figure 24:
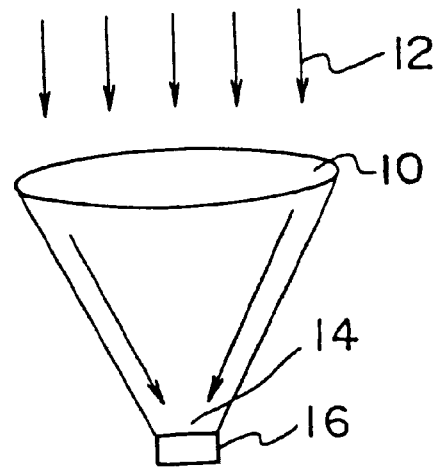
FIG. 24 is a diagram showing the positional relationship between a conversion spot and a solar cell whose positions coincide with each other.
Figure 25:
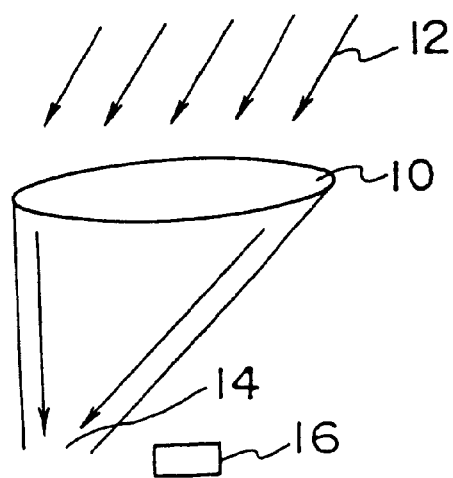
FIG. 25 is a diagram showing the positional relationship between a conversion spot and a solar cell whose positions are displaced from each other.
Figure 26:
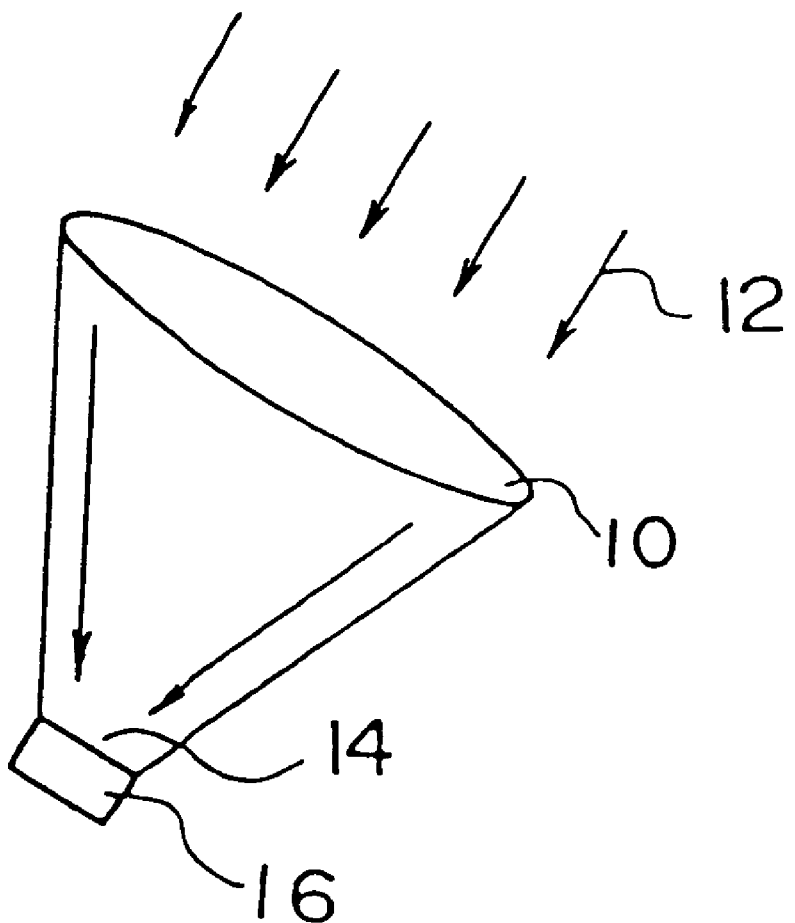
FIG. 26 is a diagram explaining a conventional tracking method according to which a converging lens is moved to track sunlight.

FIG. 23 is a diagram showing another example for maintaining controls over the horizontal movement of the cell stage 20. The cell stage 20 has a hole formed at a predetermined position thereof for receiving a bar 134 projected from the stage pedestal 40. With this structure, controls over the horizontal movements of the cell stage 20 by using the stage pedestal 40 can remain effective even if the cell stage 20 has moved vertically.

As described above, according to this invention in which the sun is tracked by utilizing cooling water, no dedicated energy for the tracking is necessary, which contributes to saving energy.

Also, since the solar cells are always cooled by cooling water, high performance of electricity generation by the solar cells can be ensured.

In addition, more reliable controls over horizontal movement of a cell stage is achieved by utilizing rotation forces of waterwheels.

Further, when a shape memory alloy ON-OFF valve is used to switch water currents for moving a cell stage, no other energy is consumed to open/close the valve, which also contributes to energy saving.

Still further, the cell stage can be moved not only horizontally but also vertically by adjusting the level of cooling water in the vessel, so that displacement of converged spots can be more closely tracked.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A converging solar module comprising:

a plurality of converging lenses for converging sunlight;

a plurality of solar cells each arranged where a converged spot is formed, the converged spot being formed at a focal point of each of the plurality of converging lens or a vicinity thereof;

a cell stare for carrying the solar cells;

a position detection sensor provided to the cell stage in a position corresponding to one of the plurality of converging lenses;

driving means for moving either one of the cell stage or the plurality of converging lenses such that a converged beam from the plurality of converging lenses falls on the center of the position detection sensor to form a converged spot thereon, the driving means comprising a pressing member which is driven by hydro-pressure; and wherein the cell stage is movable in the horizontal direction, supported on a pair of adjacent side edges by elastic members, and provided on another pair of adjacent side edges with the driving means.

2. A converging solar module comprising:

a plurality of converging lenses for converging sunlight;

a plurality of solar cells each arranged where a converged spot is formed, the converged spot being formed at a focal point of each of the plurality of converging lens or a vicinity thereof;

a cell stage for carrying the solar cells;

a position detection sensor provided to the cell stage in a position corresponding to one of the plurality of converging lenses;

driving means for moving either the cell stage or the plurality of converging lenses such that a converged beam from the plurality of converging lenses falls on the center of the position detection sensor to form a converged spot thereon, the driving means utilizing hydro-pressure; and wherein the position detection sensor comprises four trapezoid heat collecting panels together forming a square having a hole at the center which is as large as a solar cell and converged by a transparent member or reflecting member; and a shape memory alloy ON-OFF valve for switching hydro-pressure for driving the driving means provided below each of the four trapezoid heat collecting panels.

3. A cell stage for carrying solar cells, having a square shape with one corner extending in a vertical direction, wherein two edges forming the corner extending in a vertical direction have tapered parts which contact stage driving bars;

two edges opposing the two edges forming a corner opposite said corner extending in a vertical direction are supported by elastic members; and the cell stage is horizontally movable when the stage driving bars move horizontally in cooperation with forces generated by an action of the tapered parts in a direction where the stage driving bars have moved and in a direction perpendicular to that direction and a reacting force generated by the elastic members.

* * * * *

UNITED STATES PATENT AND TRADEMARK OFFICE
CERTIFICATE OF CORRECTION

PATENT NO.   : 6,127,620
DATED        : October 3, 2000
INVENTOR(S)  : Tange et al.

It is certified that error appears in the above-identified patent and that said Letters Patent is hereby corrected as shown below:

Column 20, claim 1,
Line 3, "cell stare" should read -- cell stage --.
Line 7, after "moving either", delete -- one of --.

Column 20, claim 3,
Line 52, after "two edges" (first occurrence), delete " opposing the two edges".
Line 59, "that direction" should read -- a direction --.

Signed and Sealed this

Twenty-third Day of October, 2001

Attest:

*Nicholas P. Godici*

NICHOLAS P. GODICI
*Attesting Officer*  *Acting Director of the United States Patent and Trademark Office*